United States Patent [19]

Filler et al.

[11] Patent Number: 5,706,813

[45] Date of Patent: Jan. 13, 1998

[54] FOCAL NEUROGRAPHIC MAGNETIC RESONANCE IMAGING SYSTEM

[75] Inventors: Aaron G. Filler, London, United Kingdom; Franklyn A. Howe, London, England

[73] Assignees: University of Washington, Seattle, Wash.; St. George's Hospital Medical School; Cancer Research Campaign - Technology Limited, both of London, England

[21] Appl. No.: 819,949

[22] Filed: Mar. 18, 1997

Related U.S. Application Data

[63] Continuation of Ser. No. 254,102, Jun. 6, 1994, abandoned, which is a continuation-in-part of Ser. No. 72,625, Jun. 4, 1993, abandoned, which is a continuation-in-part of Ser. No. 28,795, Mar. 8, 1993, Pat. No. 5,560,360.

[30] Foreign Application Priority Data

| Mar. 9, 1992 | [GB] | United Kingdom | 9205058 |
| Mar. 13, 1992 | [GB] | United Kingdom | 9205541 |
| Mar. 30, 1992 | [GB] | United Kingdom | 9207013 |
| May 5, 1992 | [GB] | United Kingdom | 9209648 |
| May 21, 1992 | [GB] | United Kingdom | 9210810 |
| Jul. 31, 1992 | [GB] | United Kingdom | 9216383 |
| Jan. 22, 1993 | [GB] | United Kingdom | 9301268 |

[51] Int. Cl.$^6$ ................................................ A61B 5/055
[52] U.S. Cl. ................................. 128/653.5; 324/318
[58] Field of Search ........................ 128/653.2, 653.5; 324/318, 320–322

[56] References Cited

U.S. PATENT DOCUMENTS

| 3,735,247 | 5/1973 | Harker | 128/653.1 |
| 4,516,582 | 5/1985 | Redington | 128/653 |
| 4,528,985 | 7/1985 | Macovski | 128/653 |
| 4,647,857 | 3/1987 | Taber | 324/309 |

(List continued on next page.)

FOREIGN PATENT DOCUMENTS

| 36 39 140 A1 | 5/1987 | Germany. | |
| 3133423 | 6/1991 | Japan. | |
| 5130980 | 5/1993 | Japan | 128/653.5 |
| WO 87/01199 | 2/1987 | WIPO. | |
| 9013045 | 11/1990 | WIPO | 128/653.2 |
| WO 91/17454 | 11/1991 | WIPO. | |

OTHER PUBLICATIONS

Howe, F.A., Filler, A.G., Bell, B.A. and Griffiths J.R.; "Magnetic Resonance Neurography"; *Magnetic Resonance in Medicine* 28:328–338 (1992).

M. Doran et al., "Normal and Abnormal White Matter Tracts Shown By MR Imaging Using Directional Diffusion Weighted Sequences," *Journal Of Computer Assisted Tomography* 14(6): 865–873 (Nov./Dec. 1990).

(List continued on next page.)

*Primary Examiner*—Marvin M. Lateef
*Assistant Examiner*—Brian L. Casler
*Attorney, Agent, or Firm*—Christensen O'Connor Johnson & Kindness PLLC

[57] ABSTRACT

A focal magnetic resonance imaging system (20) for generating images of neural structures such as nerves. The system (20) includes a control and analysis system (22), a polarizing system (24), and splint-coil assembly (26). The splint-coil assembly (26) includes a splint (28) and various magnetic and electromagnetic coils (32,40,42) incorporated within the splint (28). The splint (28) conforms snugly to a patient's body part, e.g., limb, so that the coils (32,40,42) are fixed with respect to the patient's body part. The splint-coil assembly (26) can be positioned independently of a main field generated by the polarizing system (24), and a stabilization apparatus (156) is included for adjustably securing the position of the splint-coil assembly (26) during imaging. A focal magnet assembly (60) that can serve as the polarizing system (24) is also provided. Further provided is a method of operating the control and analysis system (22) to consistently generate images depicting the fascicular structure of nerves (100) by ensuring that image gradients (108) are oriented orthogonal to the nerves (100).

20 Claims, 12 Drawing Sheets

U.S. PATENT DOCUMENTS

| | | | |
|---|---|---|---|
| 4,714,081 | 12/1987 | Dumoulin et al. | 128/653 |
| 4,777,957 | 10/1988 | Wehrli et al. | 128/653 |
| 4,836,209 | 6/1989 | Nishimura | 128/653 |
| 4,875,485 | 10/1989 | Matsutani | 128/653.5 |
| 4,902,973 | 2/1990 | Keren | 324/312 |
| 5,007,425 | 4/1991 | Vanek et al. | 128/653.2 |
| 5,070,876 | 12/1991 | Wright | 128/653.3 |
| 5,078,141 | 1/1992 | Suzuki et al. | 128/653 |
| 5,079,505 | 1/1992 | Deimling et al. | 324/311 |
| 5,134,372 | 7/1992 | Inoue | 324/309 |
| 5,143,068 | 9/1992 | Muennemann et al. | 128/653.5 |
| 5,151,655 | 9/1992 | Harms et al. | 324/309 |
| 5,185,576 | 2/1993 | Vavrek et al. | 324/318 |
| 5,218,964 | 6/1993 | Sepponen | 128/653 |
| 5,250,899 | 10/1993 | Listerud et al. | 324/309 |
| 5,261,405 | 11/1993 | Fossel | 128/653.2 |
| 5,278,504 | 1/1994 | Patrick et al. | 324/318 |
| 5,320,103 | 6/1994 | Rapoport et al. | 128/653.5 |
| 5,379,768 | 1/1995 | Smalen | 128/653.5 |
| 5,400,787 | 3/1995 | Marandos | 128/653.5 |
| 5,417,212 | 5/1995 | sZeles | 128/653.2 |
| 5,435,302 | 7/1995 | Lenkinski et al. | 128/653.5 |

OTHER PUBLICATIONS

M. Doran et al., "Magnetic Resonance: Perfusion and Diffusion Imaging," *Neuroradiology* 32:392–398 (1990).

M.E. Moseley et al., "Diffusion–weighted MR Imaging of Anisotropic Water Diffusion in CAT Central Nervous System," *Radiology*, 176:439–445 (Aug. 1990).

J.V. Hajnal et al., "MR Imaging of Anisotropically Restricted Diffusion of Water in the Nervous System: Technical Anatomic, and Pathologic Considerations," *Journal Of Computer Assisted Tomography*, 15:1–18 (Jan. 1991).

M.E. Moseley et al., "Diffusion–Weighted MR Imaging of Acute Stroke: Correlation with T–2 Weighted and Magnetic Susceptibility–Enhanced MR Imaging in Cats," *ANJR* 11:423–429 (May/Jun. 1990).

D. Chien et al., "MR Diffusion Imaging of the Human Brain," *Journal Of Computer Assisted Tomography*, 14(4):514–520 (Jul./Aug. 1990).

G.M. Bydder et al., "MR Imaging of Anisotropically Restricted Diffusion of Water in Tumors of the Central Nervous System", *Book of Abstracts, Society of Magnetic Resonance in Medicine* (1991).

J.S. Schoeniger et al., "NMR Microscopy of Single Neurons" *Book of Abstracts, Society of Magnetic Resonance in Medicine* (1991).

Douek et al., "Myelin Fiber Orientation Color Mapping," *Book of Abstracts Society of Magnetic Resonance in Medicine*, 919 (1991).

M.E. Moseley et al., "Anisotropy in Diffusion–Weighted MRI," *Magnetic Resonance In Medicine*, 19:321 (1991).

J.R. MacFall et al., "Pre– and Postmorten Diffusion Coefficients in Rat Neural and Muscle Tissues," *Magnetic Resonance In Medicine* 20:89–99 (1991).

M.E. Moseley et al., "Ultrafast Magnetic Resonance Imaging: Diffusion and Perfusion," *Canadian Association Of Radiologists*, 42(1):31–38 (Feb. 1991).

D. LeBihan et al., "Measuring Random Microscopic Motion of Water in Tissues with MR Imaging: A Cat Brain Study," *Journal Of Computer Assisted Tomography*, 15(1):19–25 (Jan./Feb. 1991).

Chenevert et al., "Quantitative Diffusion Anisotropy in Rat Gliomas," *Book of Abstracts, Society of Magnetic Resonance in Medicine*, 787 (1991).

D. LeBihan, "Diffusion/Perfusion MR Imaging of the Brain: From Structure to Function," *Radiology*, 177:328–329 (1990).

M.E. Moseley et al., "Acute Effects of Exercise on Echo–Planar $T_2$ and Diffusion–Weighted MRI of Skeletal Muscle in Volunteers," *Book of Abstracts, Society of Magnetic Resonance in Medicine*, 108 (1991).

Neeman et al., "A Simple Method for Obtaining Cross–Term–Free Images for Diffusion Anisotropy Studies in NMR Microimaging," *Book of Abstracts, Society of Magnetic Resonance in Medicine* (1991).

J. Guy et al., "Fat Suppression MRI; Gd–DTPA Enhancement in Experimental Optic Neuritis," *Book of Abstracts, Society of Magnetic Resonance in Medicine*, 913 (1991).

G. Sze, "Recent Advances in Spinal Magnetic Resonance Imaging," *Canadian Association of Radiologists Journal*, 42(3):190–198 (Jun. 1991).

Haase et al., "NMR Chemical Shift Selective Imaging", 30 *Phys. Med. Biol.* 341–344 (1985).

Dixon et al., "Simple Proton Spectroscopic Imaging", 153 *Radiology* 189–194 (1984).

Shuman et al., "Improved Fat Suppression in STIR MR Imaging: Selecting Inversion Time Through Spectral Display", 178 *Radiology* 885–889 (1991).

D.N. Blair et al., "Normal Brachial Plexus: MR Imaging," *Radiology*, 165:763–767 (1987).

L.M. Fahr et al., "Imaging of Peripheral Nerve Lesions," *Orthopedic Clinics Of North America*, 19(1):27–41 (Jan. 1988).

B. Roger et al., "Imaging of Posttraumatic Brachial Plexus Injury," *Clinical Orthopaedics And Related Research*, 237:57–61 (Dec. 1988).

R.R. Tash, M.D., et al., "Trigeminal Neuralgia: MR Imaging Features," *Radiology* 172:767–770 (1989).

M. Mesgarzadeh et al., "Carpal Tunnel: MR Imaging, Part II. Carpal Tunnel Syndrome," *Radiology*, 171:749–754 (1989).

M. Mesgarzadeh et al., "Carpal Tunnel: MR Imaging," *Radiology* 171:743–748 (1989).

D.S. Titelbaum et al., "Wallerian Degeneration and Inflammation in Rat Peripheral Nerve Detected by in Vivo MR Imaging," *ANJR* 10:741–746 (Jul./Aug. 1989).

M.J. Kuhn et al., "Wallerian Degeneration After Cerebral Infarction: Evaluation with Sequential MR Imaging," *Radiology* 172:179–182 (1989).

J.K. Kostelic et al., "Lumbar Spinal nerves in the Neural Foramen: MR Appearance," *Radiology* 178:837–839 (1991).

Atlas et al., "STIR MR Imaging of the Orbit," 151 *Am. J. Roentgen* 151:1025–1030 (1988).

E.C. Wong et al., "High–Resolution, Short Echo Time MR Imaging of the Fingers and Wrist with a Local Gradient Coil," *Radiology* 181:393–397 (1991).

P.B. Roemer et al., "The NMR Phased Array," *Magnetic Resonance In Medicine* 16:192–225 (1990).

C.E. Hayes et al., "Volume Imaging with MR Phased Arrays," *Magnetic Resonance In Medicine* 18:309–319 (1991).

F.G. Shellock et al., "Kinematic Magnetic Resonance Imaging of the Joints: Techniques and Clinical Applications," *Magnetic Resonance Quarterly*, 7(2):104–135 (1991).

FOCAL NEUROGRAPHIC MAGNETIC RESONANCE IMAGING SYSTEM

RELATIONSHIP TO EARLIER FILED APPLICATIONS

This application is a continuation application of application Ser. No. 08/254,102, filed on Jun. 6, 1994, now abandoned, which is a continuation-in-part application based on U.S. patent application Ser. No. 08/072,625 filed Jun. 4, 1993 now abandoned, which is itself a continuation-in-part application of original parent U.S. patent application Ser. No. 08/028,795 filed Mar. 8, 1993 U.S. Pat. No. 5,560,360, the benefit of the filing dates of which is hereby claimed pursuant to 35 U.S.C. §120. The original parent U.S. patent application (Ser. No. 08/028,795 filed Mar. 8, 1993) was based upon an earlier filed U.K. patent application No. 9301268.0, filed Jan. 22, 1993, which, in turn, is a continuation-in-part of U.K. patent application No. 9216383.1, filed Jul. 31, 1992, which, in turn, is the continuation-in-part of U.K. patent application No. 9210810.9, filed May 21, 1992, which, in turn, is a continuation-in-part of I.K. patent application No. 9209648.6, filed May 5, 1992, which, in turn, is a continuation-in-part of U.K. patent application No. 9207013.5, filed Mar. 30, 1992, which, in turn, is a continuation-in-part of U.K. patent application No. 9205541.7 filed Mar. 13, 1992, which, in turn, is a continuation-in-part of U.K. patent application No. 9205058.2, filed Mar. 9, 1992, the benefit of the filing dates of which is hereby claimed pursuant to 35 U.S.C. §119.

The contents of the original parent U.S. application No. 08/028,795 are hereby incorporated by reference.

FIELD OF THE INVENTION

The present invention relates generally to the field of magnetic resonance imaging and, more particularly, to the imaging of nerve tissue.

BACKGROUND OF THE INVENTION

Magnetic resonance imaging (MRI) is being increasingly used to image physiological structures. MRI involves the exposure of a specimen to a variety of different magnetic and radio-frequency (rf) electromagnetic fields. The response of the specimen's atomic nuclei to the fields is processed to produce an image of the specimen. More particularly, the specimen is exposed to a polarizing magnetic field, also commonly referred to as the main field. Then, an excitation field is applied perpendicular to the main field, and the resulting resonant electromagnetic responses of nuclei within the specimen is observed. The resonant electromagnetic responses of nuclei within the specimen vary for different types of nuclear species or for different chemical environments for nuclei of a single species, e.g., hydrogen. Thus, by analyzing the resonant electromagnetic responses (e.g., using a Fourier analysis), various nuclear environments and species, and therefore various component tissues, contained in the specimen can be differentiated.

However, the resonant electromagnetic response from the specimen does not alone allow identifying the locations of various component tissues within the specimen. To obtain the needed locational information, imaging gradients are introduced in addition to the main field. As a result, magnetic field gradients are established along an X, Y, Z right-handed orthogonal axes system defined within the imaging region, where the Z axis is oriented in the direction of the main field.

Thus, the imaging gradients vary the strength of the magnetic field along the X, Y and Z axes. For example, typically imaging gradients are introduced so that the magnetic field within the imaging area increases by 1 Gauss per centimeter, in the directions of the X, Y and Z axes. Because the responses of nuclei to the rf excitation field depend upon the strength of the magnetic field to which the nuclei are exposed, by using image gradients, particular regions, e.g., slices or image planes, can be analyzed. In summary, by exposing a specimen to a combination of uniform main magnetic fields, magnetic imaging gradient fields, and rf electromagnetic excitation fields, and analyzing the specimen's resonant response, images of the specimen can be constructed.

Presently, to generate these various magnetic and electromagnetic fields, magnetic resonance (MR) imaging machines 10, as shown in FIG. 1, include various coils housed and fixed in the walls of a bore 12 into which a person is inserted for imaging. The presently available MR imaging machines 10 are generally whole-body imagers, i.e., the bore 12 is large enough so that a person 14 can be slid lengthwise into the bore, and an entire cross-section of the person can be imaged. A main field coil is included in the imaging machine 10 to produce a uniform main field. In order to produce a homogenous field throughout the relatively large interior of the bore 12 with a reasonable amount of electrical power, an elaborate solenoid-type system is used. In particular, liquid helium and liquid nitrogen are used to cool the main field coil to maintain a near superconducting circuit.

In addition to the main field coils, gradient coils are inserted into the walls of the bore 12 for producing imaging gradients within the volume of the bore 12. The gradient coils are rigidly fixed to the walls of the bore 12 so that the gradient coils are fixed with respect to the main field coils and, therefore, the main field. This fixed orientation of the gradient coils with respect to the main field coils has been used in the past, in part because it has been believed that this fixed orientation is crucial to the assessment of detailed, high-resolution positional information in MR images. Because the gradient coils produce a magnetic field gradient across the interior volume of the bore 12, which is relatively large, very high power amplifiers have been required to drive the gradient coils in order to produce imaging gradients of about 1 Gauss per centimeter.

An excitation coil is also included within the walls of the bore 12 for generating rf electromagnetic excitation fields. The same excitation coil is also generally used to detect the resonant electromagnetic response of the specimen to the rf excitation field.

These whole-body MR imaging machines 10 have been used to image various physiological structures. Recently, new processes utilizing magnetic resonance have been developed to generate sharp images of neural structures, including peripheral nerves. Some of these new processes, which are disclosed in the original parent U.S. patent application Ser. No. 08/028,795, exploit anisotropic diffusion exhibited by neural structures including peripheral nerves. Anisotropic diffusion refers to the fact that a neural structure, e.g., a nerve, exhibits fluid mobility along the length of the neural structure, while fluid motion is restricted in directions perpendicular to length, i.e., the longitudinal axis, of the neural structure. By generating a set of magnetic field gradients in addition to the imaging gradients, neural structures that exhibit anisotropic diffusion are enhanced in the resulting MR images. In other words, the additional gradients allow the discrimination of fluid diffusion anisotropy exhibited by neural structures. The additional gradients are referred to as diffusion gradients, and the imaging technique is referred to generally as diffusion-weighted imaging.

In one of the diffusion-weighted imaging techniques disclosed in the original parent U.S. patent application Ser. No. 08/028,795, after carrying out fat suppression, diffusion gradients are applied perpendicular and parallel to the longitudinal axis of the neural structure, e.g., nerve, of interest. In particular, two images are generated, one with the diffusion gradient oriented perpendicular to the length of the nerve and the second image generated with the diffusion gradient oriented parallel to the length of the nerve. Because, uniquely in nerves, a large portion of the fluid flow occurs only along the length of the nerve, the anisotropic nature of the fluid flow affects the two images differently. Specifically, when the diffusion gradient is aligned with the nerve, the fluid flow causes a reduction in the signal strength from the nerve. In contrast, the anisotropic fluid flow does not affect the image generated with the diffusion oriented perpendicular to the nerve. By processing these two images, a resultant image can be generated in which the nerve stands out from other structures in the region. In fact, all other structures can be suppressed so that an image in which only the nerve appears is obtained; this image is referred to as a neurogram.

Unfortunately, for various reasons, presently available whole-body imaging machines 10 do not allow for the best exploitation of this neurographic imaging technique or the other neurographic imaging techniques disclosed in the original parent U.S. patent application Ser. No. 08/028,795. First, to effectively discriminate diffusion anisotropy in small neural structures, such as peripheral nerves, high strength diffusion gradients are often needed. For example, while standard whole-body imaging machines 10 are generally used to generate magnetic field gradients of about one Gauss per centimeter, higher strength diffusion gradients on the order of 10 Gauss per centimeter are often desirable to best discriminate the diffusion anisotropy exhibited by nerves. Typically, the gradient coils that are used to generate the imaging gradients are also used to generate the diffusion gradients. There is a practical upper limit to the strength of gradients that can be generated using these gradient coils in standard whole-body imaging machines 10, because the gradient field extends across the diameter of the interior of the bore 12, which is typically on the order of 40 centimeters. Specifically, generating high strength gradients across such a large volume requires extremely high power amplifiers, which would impose significant additional expense for such systems.

A second problem in standard whole-body imagers 10 is relative movement between the patient being imaged and the gradient fields. Because diffusion-weighted imaging is based on measuring the movement of water molecules over very small distances, this imaging technique is very sensitive to relative movement between the patient and the gradient fields. This sensitivity to patient movement is amplified when high strength diffusion gradients are used. There are two sources of relative movement between the patient and the gradient fields. The first is physical movement of the patient. The second is vibration of the gradient field coils due to electromagnetic interaction between the gradient field coils and the main field coils, particularly when high-strength gradients are used.

Another problem with standard whole-body imaging machines 10 is that the entire portion of the patient within the bore 12 is exposed to the main field and gradient fields. Thus, if high-strength gradients are used, the patient may be exposed to a health risk. When high-strength gradients are turned on and off, the resulting rate of change of the magnetic field near the heart poses a risk of causing cardiac arrhythmias in some patients.

Furthermore, while MR images are very useful to surgeons in planning operations, the usefulness of standard whole-body imaging machines 10 to surgeons is limited because MR images cannot be generated in real-time as an operation is taking place. This is due to the fact that the enclosed bore 12 does not allow a surgeon to view and access a patient while inside the bore 12.

Not only are solutions to these various hardware problems in standard whole-body imaging machines 10 needed, improvements are needed in processes for controlling imaging machines to be able to consistently generate clear images of nerves. Using the imaging techniques provided in the original parent U.S. patent application Ser. No. 08/028,795, the fascicular structure of individual nerves can be observed. This is extremely useful, as the identification of the fascicular structure of nerves can be used as the basis for distinguishing nerves from other tissues, which do not have the same fascicular structure. Further, many diseases affecting nerves have been found by the inventors to cause alterations in the diameter and image intensity of nerve fascicles, so that reliable fascicle imaging has now been appreciated to be of critical desirability in a neurographic system. Unfortunately, while the imaging techniques provided in the original parent U.S. patent application Ser. No. 08/028,795 are often able to produce images clearly depicting the fascicular structure of nerves, this is not always the case. For previously unknown reasons, using a single imaging technique, in some images the fascicular structure of a nerve is clearly shown, while in other images the fascicular structure cannot be seen.

Based on the foregoing discussion, what is needed is an MRI system that: eliminates relative patient to gradient field motion; is able to generate high strength gradients without creating a health risk; allows surgical access to a patient while being imaged; and is able to consistently depict nerve fascicles. The present invention provides a system that meets these as well as other criteria, as described in the following.

SUMMARY OF THE INVENTION

In accordance with the present invention, a focal magnetic resonance imaging system for imaging neural structures is provided. One aspect of the invention provides a splint-coil assembly that includes a splint and incorporated local gradient coils for generating high-strength gradients within the splint's interior, in which a body part, e.g., limb, of a patient is placed. The splint-coil assembly, and therefore the local gradient coils, are not fixed with respect to the polarizing field or main field generated by a main field coil, e.g., of a MR imaging machine. Rather, the splint conforms tightly around a patient's body part, so that the local gradient coils are fixed with respect to the patient. As a result, relative motion between the patient and the gradient fields produced by the local gradient coils is eliminated. The local gradient coils are positioned near the interior volume of the splint, so that the local gradient coils are in close proximity to the patient's body part. Therefore, the local gradient coils generate a gradient field within the relatively small interior of the splint, so that high-strength gradients can be generated with a far smaller amount of drive power than would be required to irradiate the entire volume of a whole body imaging machine 10, and indeed can in many cases be generated with the amplifiers presently provided in whole-body imaging machines to achieve low gradients in a large volume. Further, other areas of the patient, e.g., chest and heart, are not exposed to the fields. Preferably, the local gradient coils includes a series of coils so that gradients can be produced along any direction within the splint.

In accordance with further aspects of the present invention, the splint-coil assembly includes rf excitation and detection coils, for generating an rf electromagnetic excitation field and detecting the resulting resonant response of the body part being imaged. Additionally, the splint-coil assembly is preferably equipped with a number of sensors for sensing the position and orientation of the splint-coil assembly and, optionally, sensing magnetic fields within the splint. Furthermore, in one preferred embodiment, the splint-coil assembly also includes shim coils for shimming the main field to ensure homogeneity of the main field within the splint.

In accordance with still further aspects of the invention, in one preferred embodiment, the splint-coil assembly has access ports that allow access to the body part within the splint.

In accordance with further aspects of the invention, the splint-coil assembly is coupled to a control and analysis system that controls the fields generated by the various coils within the splint-coil assembly. The control and analysis system processes signals provided by the splint-coil assembly to generate MR images.

In accordance with further aspects of the invention, a stabilizing system for the splint-coil assembly is provided to prevent the splint-coil assembly from moving. In one form, the stabilizing system comprises adjustable nonmagnetic struts that are connected at one end to a fixed frame and at the opposite ends to the splint-coil assembly. In another embodiment of the invention, the stabilizing system comprises balancing coils attached to the splint-coil assembly to generate torques that are of equal strength but opposite direction to torques generated by the local gradient coils, thereby preventing any electromagnetically induced movement of the splint-coil assembly. In still another embodiment, the coils within the splint are formed as balanced torque pairs, so that the coils exert substantially no torque on the splint-coil assembly.

In accordance with further aspects of the present invention, a focal magnet apparatus for generating a main field is provided. The focal magnet includes magnetics that generate a homogenous magnetic field across a relatively small imaging region, just large enough to accommodate, for example, a portion of a patient's limb. This is very useful for surgical applications, in which a much smaller image area is used. The magnetics are held in a support frame that is portable and maneuverable. Furthermore, the imaging region formed by the focal magnet is substantially open, i.e., not enclosed, so that medical personnel can easily access a body part placed within the imaging region. In accordance with one preferred embodiment of the invention, the magnetics of the focal magnet include two hard magnets positioned in the support frame so that the imaging region is formed by the air gap between the hard magnets.

In accordance with still further aspects of the present invention, a MRI method that consistently provides images depicting the fascicular structure of nerves is provided. The process is based on the discovery that the fascicular pattern of nerves is only clearly seen when the image plane formed by gradients fields is perpendicular to the long axis of the nerve. Specifically, the MRI method includes the step of creating an orthogonal alignment between the nerve to be imaged and the image plane. Then, with the orthogonal image plane, one of a variety of nerve enhancing MRI methods directed toward achieving relatively high signal intensity from the fascicles within a nerve is used to produce an image.

As will be appreciated from the foregoing brief summary, a focal MRI system for generating images of neural structures is provided. The system includes a splint-coil assembly that makes it possible to create localized high-strength field gradients, without exposing sensitive regions of the patient, e.g., chest and heart, to the high-strength gradients. Furthermore, because gradient coils are built into the splint, relative movement between the patient and the gradient fields is greatly reduced. The splint-coil assembly can be used in conjunction with a standard whole-body imaging machine 10.

Or, as will be appreciated from the foregoing brief summary, the splint-coil assembly can be used in conjunction with a focal magnet apparatus provided by the present invention. The focal magnet apparatus produces a homogenous main magnetic field within an imaging region that is substantially open, allowing access to the body part being imaged. Thus, when used in conjunction with a splint-coil assembly that has access ports, the focal magnet apparatus can be used to generate MR images during surgical procedures. Furthermore, the focal magnet apparatus is maneuverable and portable for flexible use during surgery.

As will be still further appreciated from the foregoing brief summary, the present invention provides a method of consistently imaging the fascicular structure of a nerve by orienting image planes perpendicular to the longitudinal axis of the nerve.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 2:
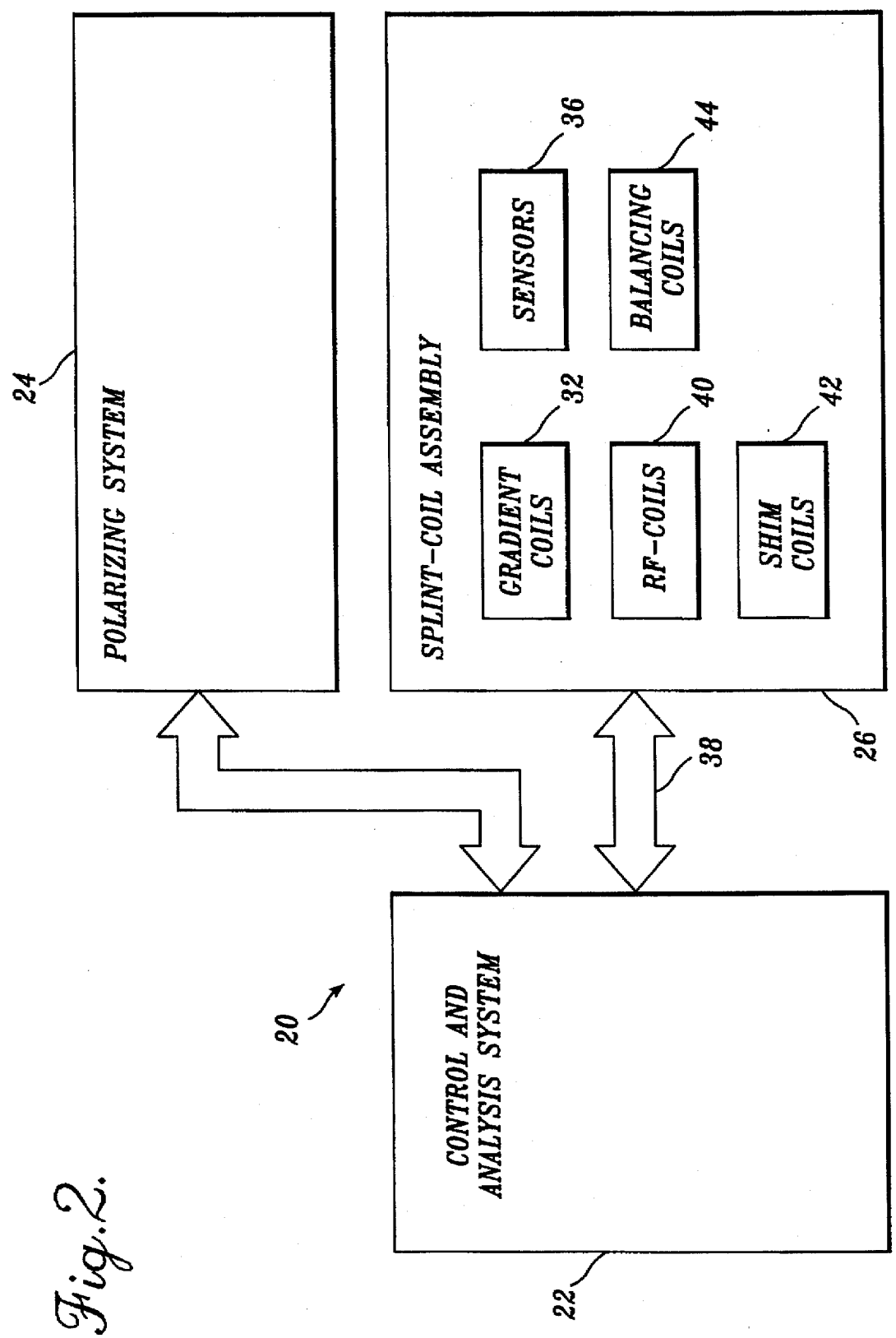
FIG. 2 is a block diagram representation of the focal neurographic magnetic resonance imaging system provided by the present invention.

FIG. 2 is a block diagram representation of a focal magnetic resonance imaging system 20 formed in accordance with the invention for imaging neural structures such as nerves. The neurographic system 20 includes a control and analysis system 22, a polarizing system 24 and a splint-coil assembly 26. The control and analysis system 22 is coupled to the polarizing system 24, and the splint-coil assembly 26 to cause the polarizing system 24 and the splint-coil assembly 26 to generate magnetic and electromagnetic fields within a patient's body part that is to be imaged. In particular, in one preferred embodiment, the polarizing system 24 generates a polarizing magnetic field (referred to herein as the main field) and the splint-coil assembly 26 generates magnetic field gradients and radio-frequency (rf) electromagnetic excitation fields. The splint-coil assembly 26 senses the resonant response of the body part to the magnetic and electromagnetic fields, and the sensed resonant response is supplied to the control and analysis system 22 via an interface 38. The control and analysis system 22 processes the sensed resonant response to produce an image of a region of the body part.

SPLINT-COIL ASSEMBLY

Figure 3:
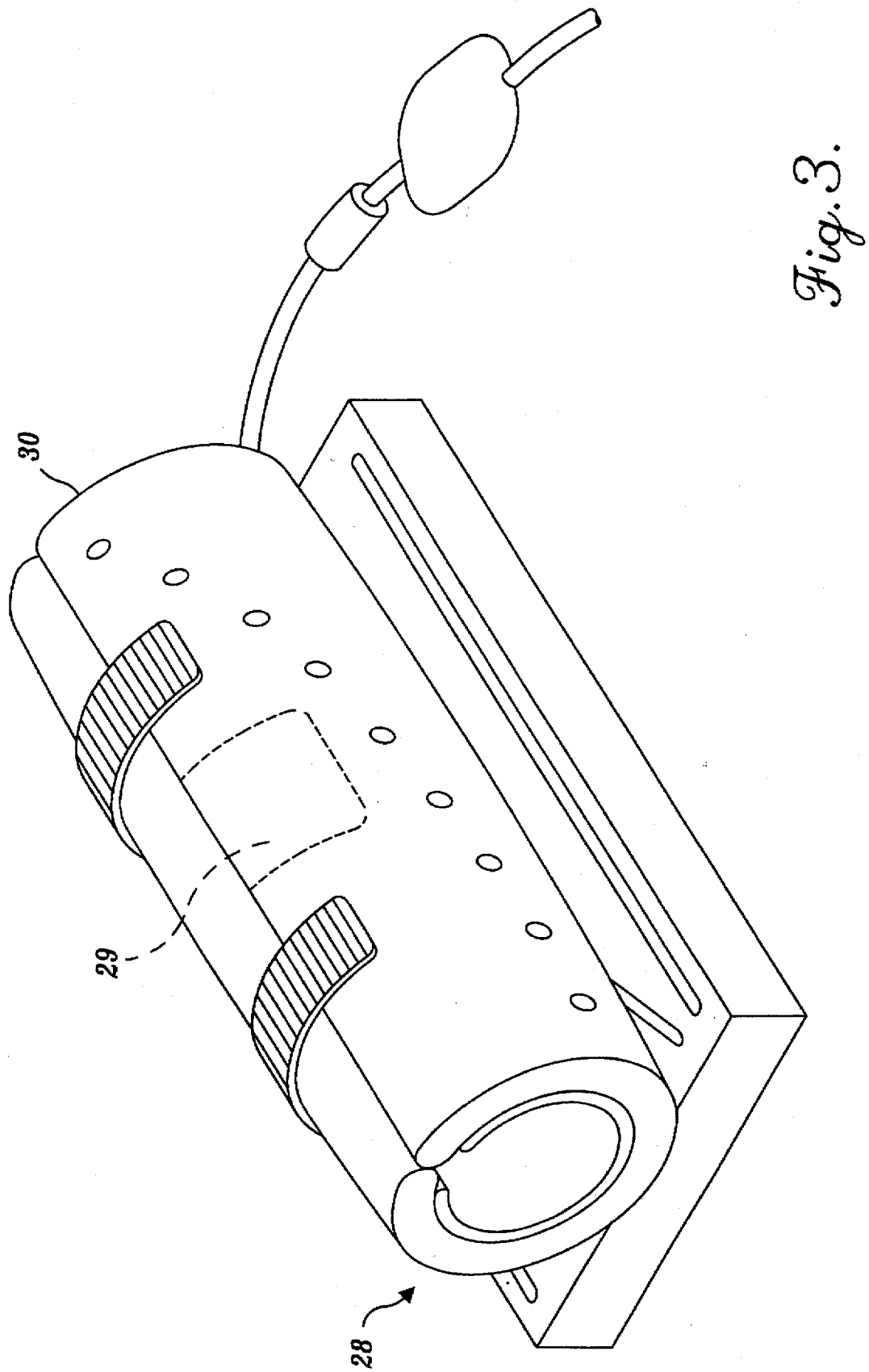
FIG. 3 is a pictorial illustration of a splint formed in accordance with the invention.

The splint-coil assembly 26 includes a splint 28 as shown, for example, in FIG. 3. The splint 28 is constructed to conform snugly to a particular body part. The particular splint 28 shown in FIG. 3 includes a sleeve 30 that conforms to a leg or arm. Preferably, the splint 28 has an access port 29 for allowing viewing and surgical access to the body part. Other nonessential details of the splint 28 are described in the original parent U.S. patent application Ser. No. 08/028,795, the subject matter of which is incorporated herein by reference.

In addition, as provided by the present invention, various coils (not shown in FIG. 3 but illustrated in later figures) are incorporated within the splint 28. As illustrated in block diagram form in FIG. 2, local gradient coils 32, rf excitation and return coils 40, main field shim coils 42, and balancing coils 44 can be included within the splint-coil assembly 26. The splint-coil assembly 26 can be used either with a standard whole-body imaging machine 10, or it can be used with a focal main field magnet assembly formed in accordance with the invention, as described in greater detail hereinafter.

Unlike prior art systems in which the gradient coils are rigidly fixed with respect to the polarizing field, the gradient coils 32 of the splint-coil assembly 26 are allowed to be positioned and moved independently of the orientation of the main field produced by the polarizing system 24. Instead, because the splint 28 conforms snugly to a patient's body part, the gradient coils 32 are fixed with respect to the patient's body part. This is important because the imaging of small neural structures, such as peripheral nerves, is very sensitive to relative movement of the patient within gradient fields. This motion sensitivity is particularly acute when relatively high-strength gradient fields are used to enhance the images of neural structures.

Fixing the gradient coils 32 within the splint 28 eliminates two sources of relative patient-gradient field movement. The integral splint-coil assembly 26 prevents patient induced body motion from causing any relative movement because the splint-coil assembly 26 moves along with the patient. Furthermore, gradient coils are typically used to generate pulse gradient fields, i.e., the gradient fields are turned on and off. The resulting electromagnetic interaction with the main field tends to cause the gradient coils to vibrate as the gradient fields are turned on and off. By mounting the gradient coils 32 within the splint 28, any vibration induced within the gradient coils 32 is simultaneously imparted on the patient, so that there is very little relative movement between the patient and the gradient fields.

Figure 1:
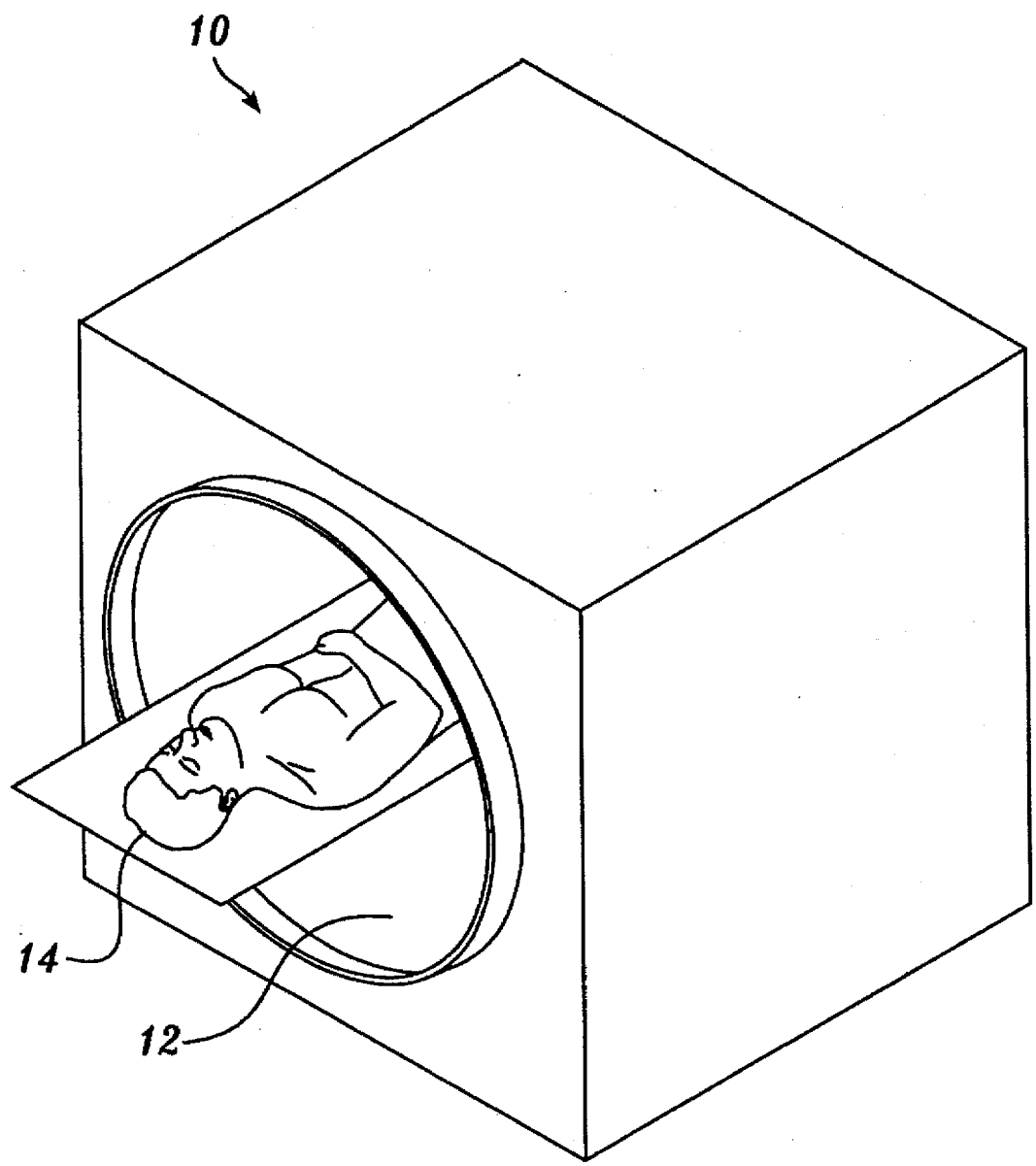
FIG. 1 is a pictorial representation of a prior art whole-body bore imaging machine.

The gradient coils 32 incorporated within the splint 28 are able to generate relatively strong gradient fields without using an excessive amount of input power and without generating a serious health hazard. As described in the original parent U.S. patent application Ser. No. 08/028,795, images of neural structures such as peripheral nerves can be greatly enhanced when high-strength gradient fields are used. For example, while typically gradient field strengths of approximately 1 Gauss per centimeter are used for image gradients, higher strength gradients of the order of 3–5 Gauss per centimeter and up are required to suppress non-neural structures. Also, generating high strength gradients allows for higher imaging resolutions. Preferably, the gradient coils 32 are designed to generate gradient magnetic fields up to 25 gauss per centimeter. Because the gradient coils 32 generate a gradient field across a relatively small volume in comparison to prior art whole-body imaging machines 10, as shown in FIG. 1, a relatively low level of power is able to generate strong gradient fields within the interior of the splint 28. Furthermore, because the gradient field is focused to within the interior of the splint 28, other sensitive regions of the patient, such as the heart, are not exposed to the strong magnetic fields.

While the splint 28 illustrated in FIG. 3 works well with limbs, other splint designs can be used for other body parts. For example, cape-like sheaths can be designed for the shoulders and neck.

In the preferred embodiment, the gradient coils 32 include a series of coils that allow producing gradient fields with any desired orientation and shape within the splint 28. As a minimum, the gradient coils 32 should allow simultaneously producing gradient fields along three orthogonal directions, i.e., along an X, Y, Z reference frame, and the orientation of the X, Y, Z reference frame should be completely controllable. This is particularly important for effective imaging of neural structures such as nerves. Various techniques, as provided in the original parent U.S. patent application Ser. No. 08/028,795, can be used to enhance neural structures such as nerves. One technique disclosed in the original parent U.S. patent application exploits the anisotropic quality of fluid diffusion in nerves to produce a nerve enhanced image by the use of diffusion gradients oriented perpendicular and parallel to the length of a nerve. Thus, for this technique the gradient coils must be able to generate diffusion gradients in various directions to follow the path of a nerve.

A wide variety of coil types, shapes, and patterns are available for use as the gradient coils 32 in the splint 28 to provide the needed ability to orient and shape the gradient fields. The basic design requirements are that the local gradient coils 32 have a sufficiently large number of controllable units so that magnetic gradients can be established along any orientation within the splint 28.

Figure 5A:
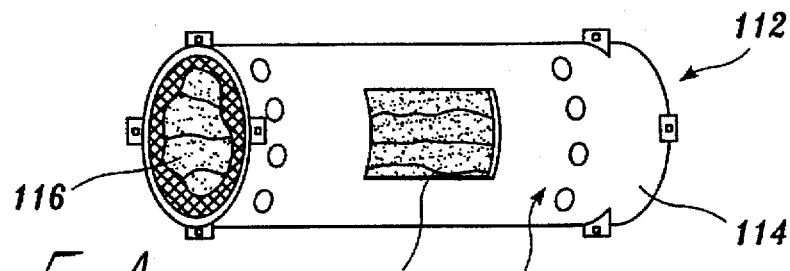
FIGS. 5A-5E are pictorial illustrations of a splint including coils and sensors in accordance with the present invention.

FIGS. 5A–5E illustrate one preferred coil design for the splint-coil assembly. The splint 112 shown in FIGS. 5A–5E is formed for a limb, e.g., an arm. As shown in FIG. 5A, the splint 112 has a rigid cylindrical exterior shell 114 and an inflatable interior liner 116 that can be adjusted to snugly fit a limb.

The inflatable interior liner 116 can be made of a thin film plastic such as polyethylene filled with a conformable substance such as water containing gel, silicone, foam, or cobalt-chloride doped water. A pump (not shown) is included to allow the fluid to be introduced into the liner 116 from a reservoir (not shown) under pressure, forcing the liner 116 against the patient's skin and immobilizing the region under examination. A release valve (not shown), allows the fluid within the liner 116 to return to the reservoir, relieving pressure within the liner 116. By employing thin flexible polyethylene or other plastic for the liner 116 and paramagnetically doped water for the conformable substance within the liner 116, edge effects at the surface of the region under examination that might otherwise be experienced using fat suppression are reduced. This can be important, because the surface of a region under examination (i.e., the patient's skin) presents an abrupt transition in the nature of the material being imaged. The field inhomogeneity caused by this tissue-to-air interface causes the fat signals in the patient's surface adipose tissue to spread out and/or shift in frequency relative to deeper lying fat surrounding the nerve.

An access port 113 is formed in the splint 112 to allow access to the interior region of the splint 112. Preferably, a similar access port is formed on the opposite side of the splint 112. Various layers of coils are formed within the shell 114.

Figure 5B:
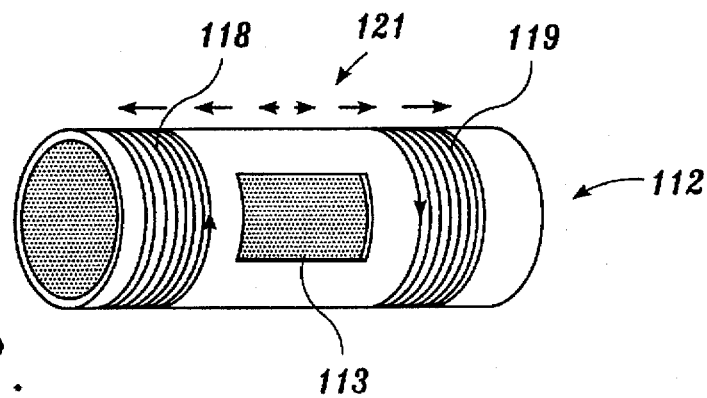
Figure 5C:
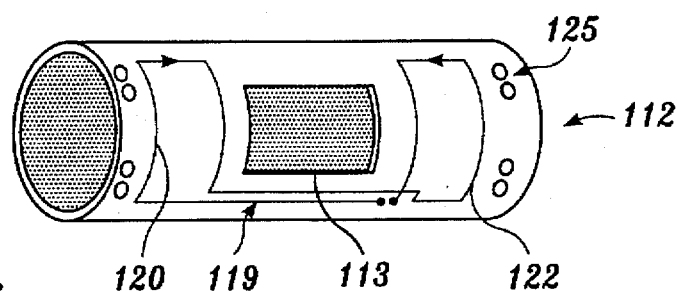
Figure 5D:
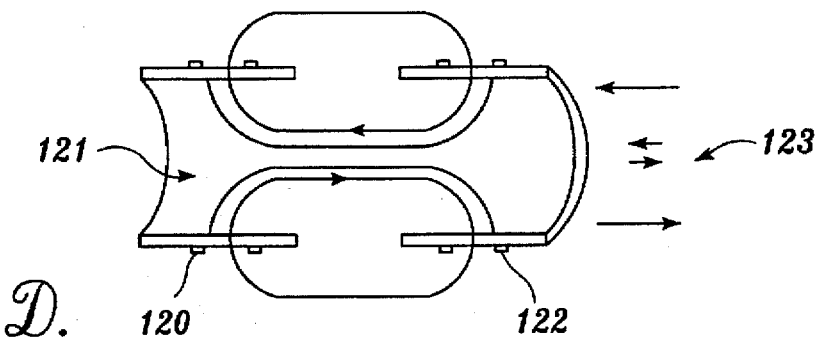

FIGS. 5B and 5C illustrate layers of coils that can be used to create field gradients. The interior-layer view of FIG. 5B illustrates a first pair of coils having a left solenoid winding 118 and a right solenoid winding 119 wound to have opposite current flows, i.e., clockwise and counterclockwise. The solenoid windings 118, 119 are cylindrically wound to be concentric with the longitudinal axis of the splint 112. The left winding 118 is located to the left of the access port 113 and the right winding 119 is located to the right of the access port 113. The coils 118, 119 produce a magnetic field gradient along the length of the splint 112, i.e., in the direction of the splint's longitudinal axis, which direction will be referred to here as the Z direction. The resultant field gradient produced by the coils 118, 119 is illustrated generally by the arrows 121, i.e., the magnetic field strength decreases towards the mid point of the length of the splint.

Additional layers of coils having different orientations are needed to produce gradient fields in other directions. For example, FIG. 5C illustrates another layer of the shell 114 having a coil pair, each coil of the pair having two loops. The coil 19 of the coil pair has a loop 120 located on the left side of the access port 113 and a loop 122 located on the right side of the access port 113. The loops 120, 122 produced a gradient field in a Y direction, orthogonal to the Z direction. This is accomplished by shaping and positioning the loops 120, 122 such that each encloses an axis parallel to the Y direction. The second coil (not shown) of the coil pair has the same shape, but is positioned on the opposite side of the splint 112. The winding-sense of the left loop 120 is such that it produces magnetic flux towards the center of the splint, and the right loop 122 produces magnetic flux in the opposite direction, i.e., away from the center of the splint 112. The resulting field gradient as seen when looking down onto the splint 112 is shown by the flux lines 121 in FIG. 5D.

The arrows 123 illustrate how the flux lines 121 produce a gradient in the Y direction such that the magnetic field is weaker towards the center of the splint 112.

Another layer of coils (not shown) is also included to create field gradients in an X direction, perpendicular to the Y and Z directions. These X coils are formed as a coil pair, each having the same shape as the two-loop coil 120, 122 shown in FIG. 5C, but the X coils are located at the top and bottom of the splint 112 so that each of the coils' loops encloses axes parallel to the X direction. The X, Y and Z coils can be controlled to produce a resultant gradient field having any desired orientation.

The gradient coils shown in FIGS. 5B and 5C are formed as balanced torque pairs, i.e., each coil pair produces no net torque on the splint 112. As a result, the gradient coils do not cause significant movement of the splint 112. Additional small coil pairs 125 can also be distributed around the perimeter of the splint 112, near its ends, as shown in FIG. 5C. These additional small coil pairs 125 can be used to counter any residual torques that may be exerted on the splint.

Coil arrangements other than that illustrated in FIGS. 5B and 5C for creating field gradients are also possible. For example, coils could be arranged as a series of cylindrical sections, partially overlapping, distributed along the length of the splint 112. In this fashion, the orientation of the gradient field could be individually adjusted within each of the cylindrical sections of coils about the splint 112.

The layers of coils previously described with reference to FIGS. 5B and 5C can be used to generate image gradients and diffusion gradients, and main field shims as well. Or, alternatively, the previously described layers can be dedicated to create image and diffusion gradients, and additional layers of coils can be included as shim coils.

Preferably, some form of provision for main field shimming is included within the splint 112, so that minor adjustments can be made to the main field within the interior of the splint 112. In one preferred embodiment, sensors 124, as illustrated in FIG. 5A, are included within the splint 112 for sensing the main field distribution within the splint 112. If this information is fed back to the control and analysis system 22, the polarizing shims can be controlled to precisely adjust the main field within the splint 112 to ensure gross main field uniformity. Alternatively, or additionally, rf signal-based shimming and autoshimming techniques can be used for fine shimming. Precise shimming of the main field in this manner improves the effectiveness of fat suppression and diffusion-weighted imaging techniques, as provided in the original parent U.S. patent application Ser. No. 08/028, 795.

Figure 4:
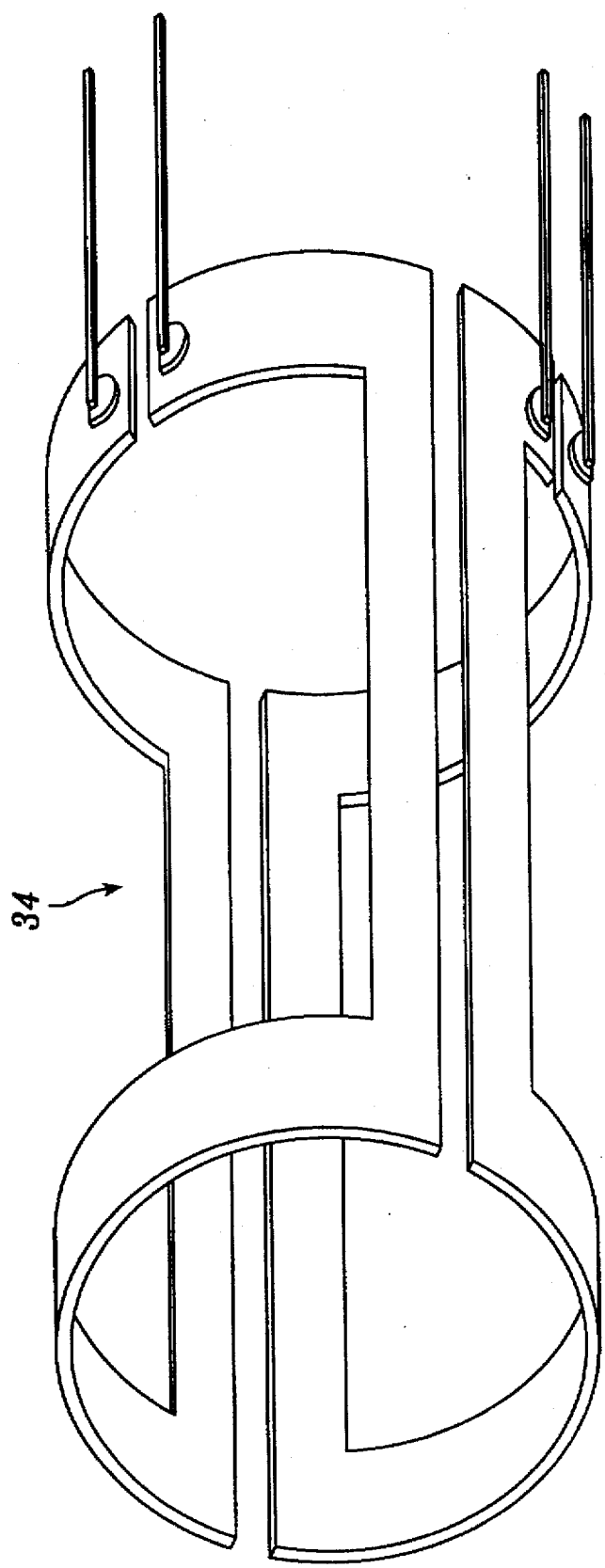
FIG. 4 is a pictorial illustration of a rf coil pair formed in accordance with certain aspects of the invention.

In one preferred embodiment, the splint 112 also includes rf excitation and return coils. The rf coils 40 can be formed using various presently available designs, including surface coils, solenoid coils, or multi-coil arrays, such as phased arrays. For example, two-, four-, or six-phased array coils may be used, or a large number of surface coils arranged in rows or sheets to optimize homogeneity for noise suppression can also be used. The coil pair 34 shown in FIG. 4 is one simple example of an rf coil pair. A wide variety of other shapes and patterns formed of wire or copper sheeting are possible by winding, cutting, punching, or etching through a photolithography process. The basic shapes and manufacturing methods for these coils are well known to those skilled in the art of MR gradient coil design and manufacture.

Figure 5E:
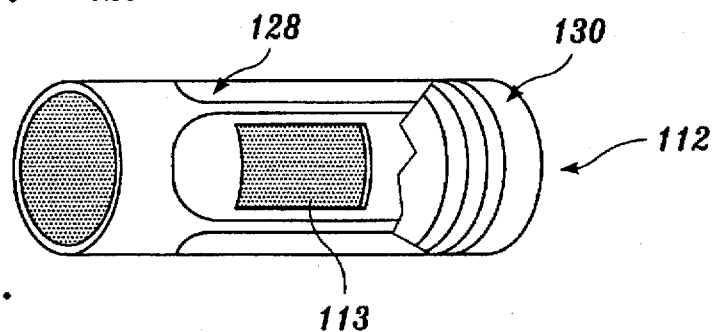

In one preferred embodiment, rf coils 128 and 130 are formed in two further layers of the splint 112, as illustrated in FIG. 5E. The coils 128 are a series of surface coils, and the coils 130 are formed in a solenoid arrangement. The rf coils are multiplexed and phase adjusted using well known phase array techniques, so that an rf excitation field can be generated in any direction and the resulting resonant response of the patient can be sensed in any direction. Thus, loss of efficiency in one coil as the rf field ceases to be perpendicular to the main field can be compensated by components of another field so positioned. If the splint 112 is used in a traditional whole-body imaging machine, the rf transmit coils in the machine can be used to generate the rf excitation field. The surface coils 128 in the splint 112 would be used only for sensing the resulting resonant response. In this arrangement, the array of coils 128 allows appropriate compensation as the rf excitation field ceases to be perpendicular to the main field.

Because the splint 112 is allowed to be positioned independently of the main field, some mechanism is needed to determine the orientation between the main field and the fields generated by the coils within the splint 112. For example, it is not necessary that the image gradients be oriented in a parallel-orthogonal alignment with the main field, i.e., X, Y, Z orthogonal image gradients with one of the X, Y, Z gradient axes being parallel with the main field direction is not needed. However, the orientation of the image gradients with respect to the main field is needed to properly plan the use of rf excitation and receive coils. In other words, as long as the relative orientation of the image gradients with respect to the main field is known, the image gradients can be oriented obliquely with respect to the main field; though it may be necessary to compensate for cross product effects due to the interaction of the image gradients and the main field.

The sensors 36 illustrated in FIG. 2 as part of the splint-coil assembly 26 can be used to determine the relative orientation of the splint with respect to the main field. In one embodiment, the sensors 36 include the previously described sensors 124, shown in FIG. 5A, for sensing the main field. The sensors 124 shown in FIG. 5A can actually include two types of sensors: sensors for measuring magnetic fields, commonly referred to as magnetometers; and sensors for sensing electromagnetic fields, commonly referred to as rf sensors. These sensors 124 can then be used to sense the various field strengths and orientations for determining the relative orientation of the fields, as well as for providing feedback that can be used in controlling the splint coils to precisely generate any desired field distribution. In particular, the data provided from the sensors 124 are fed back via the interface 38 (shown in FIG. 2) to the control and analysis system 22, which can use the data to analyze the image data and to control the various coils within the splint 112. Furthermore, as part of a safety system, the sensors 36 can included sensors for detecting excess rapid movement of the splint 112 to cause an abort of a gradient application sequence.

Alternatively, laser positioning boxes 132 can be included on the splint 112, as shown in FIG. 5A, as part of a laser positioning system that determines the orientation of the splint 112 with respect to the main field. Further, the directions of the splint generated fields relative to the splint can be determined based on the excitation signals applied to the splint. This information can then be combined to determine the orientation of the splint and the splint generated fields with respect to the main field.

Stabilization Apparatus

While the splint-coil assembly 26 is independent of the polarizing system 24, so that the splint-coil assembly 26 can be positioned with any orientation with respect to the polarizing system 24, the splint-coil assembly 26 must be stabilized so that it does not move while images are being generated. In other words, once a particular orientation of the splint-coil assembly 26 is selected, the splint-coil assembly 26 must be stabilized to prevent movement of the splint-coil assembly 26 while an image is being generated. There are two sources of splint-coil assembly 26 movement: patient movement; and electromagnetic forces on the coils within the splint-coil assembly 26.

Figure 6A:
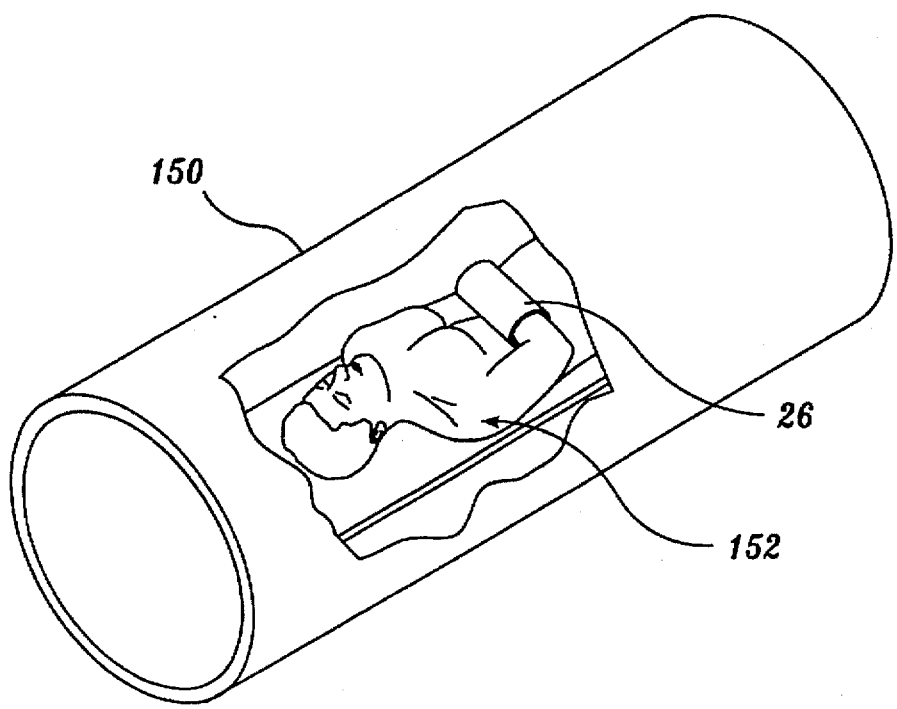
FIGS. 6A and 6B pictorially illustrate one use of a splint-coil assembly formed in accordance with the present invention.
Figure 6B:
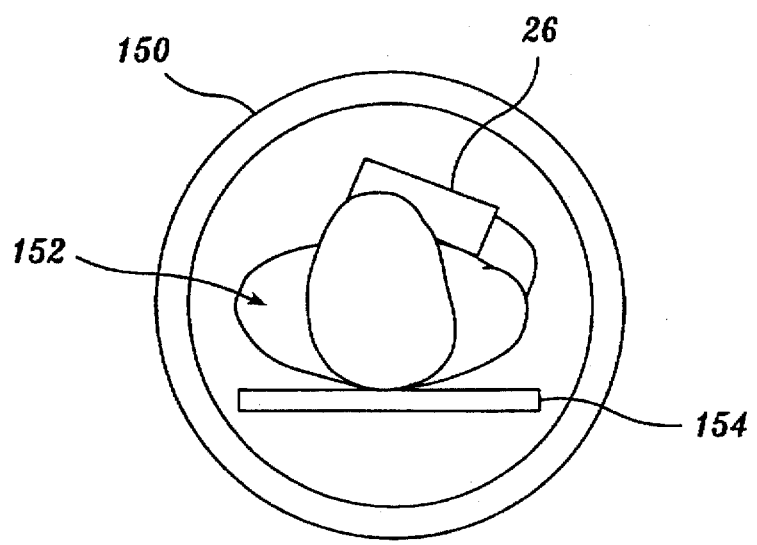
Figure 7A:
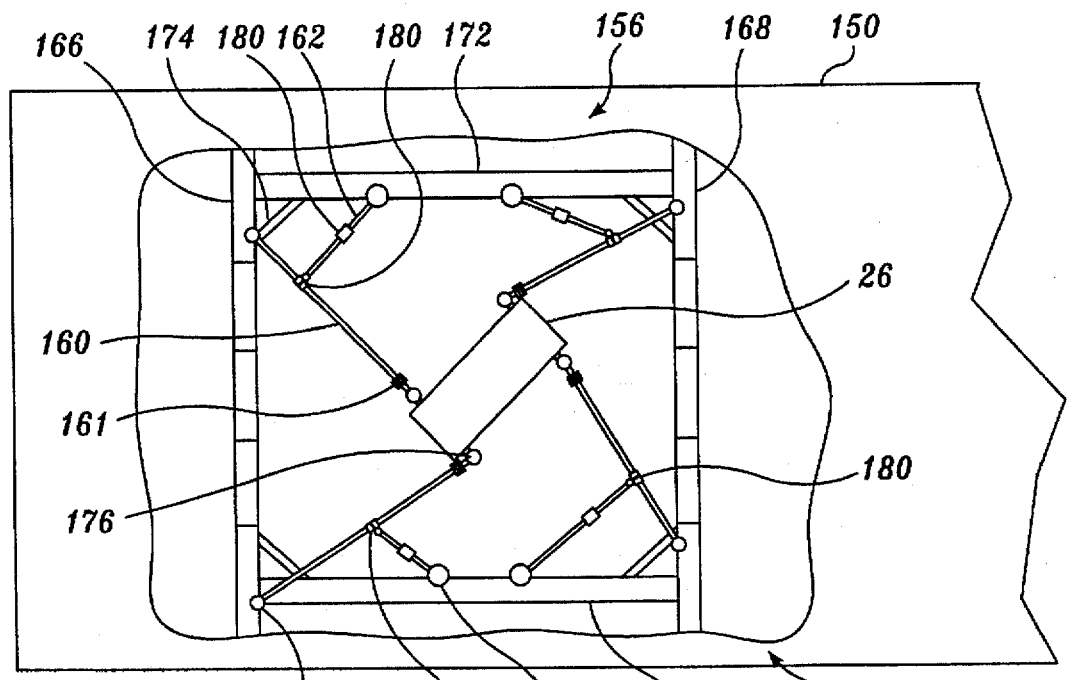
FIGS. 7A-7C are respectively a top, side, and end view of a stabilization apparatus formed in accordance with the invention for stabilizing a splint-coil assembly.
Figure 7B:
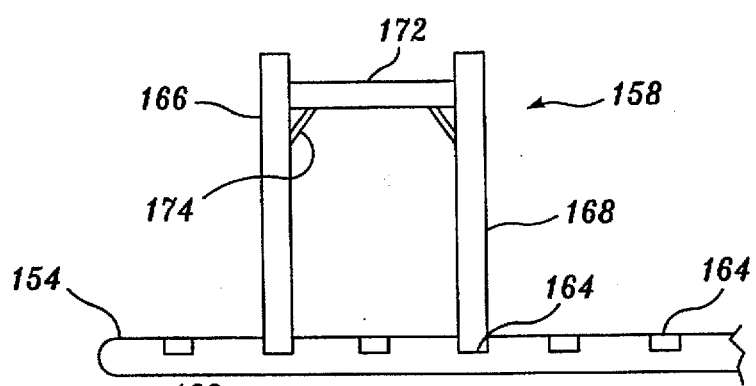
Figure 7C:
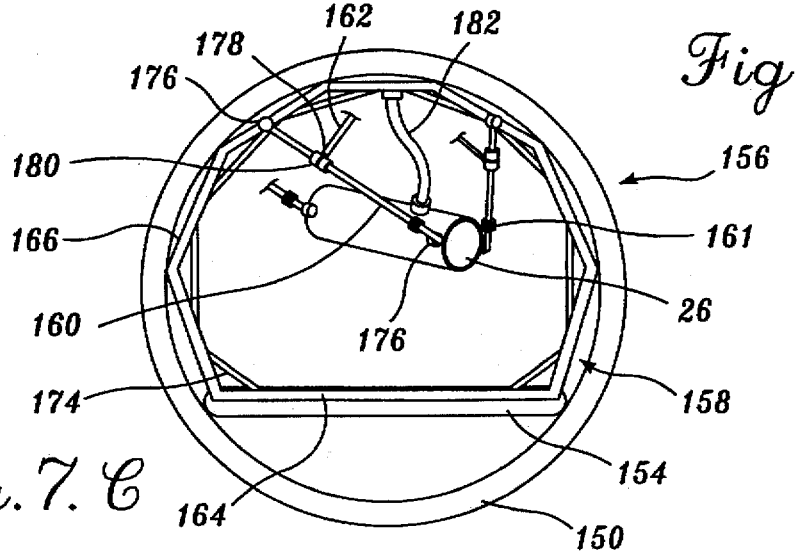

In one preferred stabilization apparatus provided by the present invention to control both sources of movement, the splint-coil assembly 26 is fixed to a rigid structure by way of detachable and adjustable struts. Preferably, the struts are formed of a nonmagnetic material such as a carbon-fiber or epoxy plastic, so as to eliminate interaction with magnetic and electromagnetic fields. FIGS. 7A-C illustrate a preferred strut stabilization system for using the splint-coil assembly 26 in a whole-body main field bore 150, as shown in FIGS. 6A and 6B. A similar structure could be formed for use with the local main field magnet assembly, described hereinafter. The bore 150 contains magnetics for generating a main field in its interior. As seen in FIGS. 6A and 6B, a patient 152 lies within the bore 150 on a slidable stretcher 154. The splint-coil assembly 26 is fit on, e.g., the patient's arm.

The stabilization apparatus 156 shown in FIGS. 7A-C includes a frame 158 and extendible rods 160, 162 that secure the splint-coil assembly 26 at any desired position and orientation within the frame 158. The frame 158 is fixed to the stretcher 154 at receiving tracks 164 formed across the stretcher 154 at various points along the length of the stretcher 154, as shown in the side view of the stretcher 154 and frame 158 in FIG. 7B. The frame 158 includes support hoops 166, 168 and horizontal cross bars 170, 172. The frame 158 is made rigid by the use of triangulation braces 174.

Four extendible support rods 160 are connected at one end to the frame 158 and, at the other end, to the splint-coil assembly 26 at spaced apart locations. Universal joints 176 are used at the points of connection, so that the extendible support rods 160 can pivot. The extendible support rods 160 preferably are formed of two segments, with one segment being permanently attached to the splint-coil assembly 26 by a universal joint 176. The two sections of the extendible support rod 160 are then connected by a connector 161, which can include screws for securing the extendible support rod sections together. Four extendible triangulation rods 162 are connected from an middle section of the extendible support rods 160 to the horizontal cross bars 170, 172, also using universal joints 178.

The length of each of the extendible rods 160, 162 can be adjusted and fixed by an extension lock mechanism 180. On the four extendible support rods 160, the extension lock mechanism 180 preferably includes a connector, which forms a universal joint 176, for receiving one of the triangulation rods 162. With the extension lock mechanisms 180 opened, the splint-coil assembly 26 can moved into a desired position and orientation. Then, the extension lock mechanisms 180 can be closed to secure the splint-coil assembly 26. The interface 38 interconnecting the control and analysis system 22 and the splint-coil assembly 26 is formed as an electronics umbilical cable 182 that is secured to the frame 158. In one preferred embodiment, the electronics umbilical cable 182 contains fiber-optic connection lines, which are not affected by stray magnetic and electromagnetic fields. All of the parts of the stabilization apparatus 156 are preferably formed of a nonmagnetic material, such as a carbon-fiber or epoxy plastic.

If patient movement can be sufficiently controlled by instructing the patient to hold still, a stabilization system is only needed to prevent electromagnetic-induced movement of the splint-coil assembly 26. To accomplish this, the coils within the splint-coil assembly 26 can be formed in balanced torque pairs, as previously described with reference to FIGS. 5A–5E. Or alternatively, in accordance with further aspects of the invention, separate balancing coils 44 can be used within the splint-coil assembly, as shown generally in FIG. 2. The balancing coils 44 are activated simultaneously with the gradient coils 32 to produce an equal and opposite torque in the splint-coil assembly 26, so as to prevent movement of the sprint-coil assembly due to pulsed gradients. The balancing coils 44 are attached at a distance from the local gradient coils 32 and are magnetically shielded so as not to contribute to the gradient fields within the splint. The use of balanced torque pair coils or extra balancing coils 44 can also be used in combination with the frame stabilization apparatus described with reference to FIG. 7A and 7B, to further reduce movement of the splint-coil assembly 26. Furthermore, imaging pulse sequences are preferably ordered such that rf excitation pulses are applied and the resulting response sensed only at times at which the local gradient coils 32 and the balancing coils 44 are not producing time-varying fields, i.e., not producing any torques or vibrations. This further reduces the likelihood of the splint moving at the times images are generated.

Focal Magnet Assembly

Figure 8:
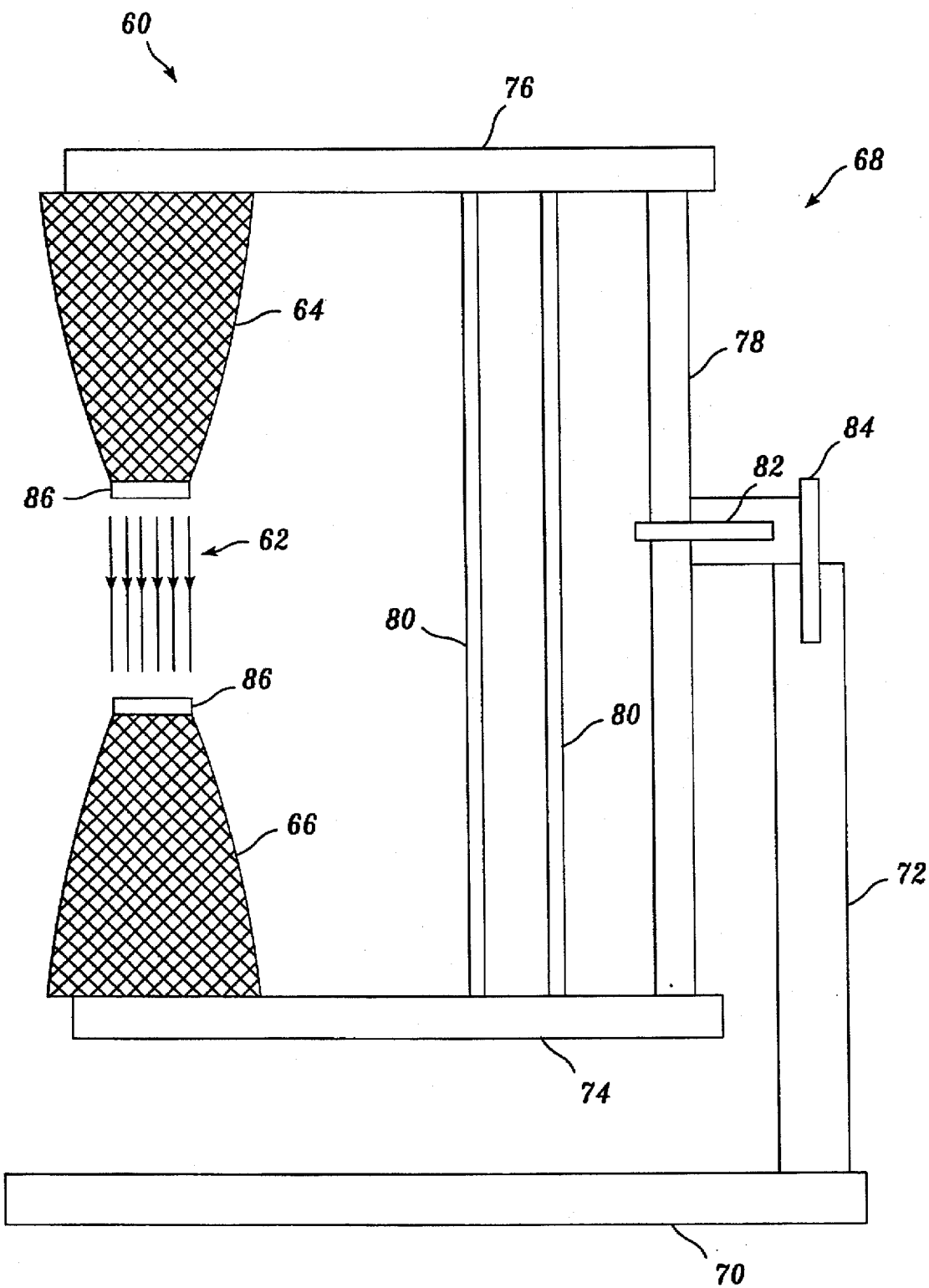
FIG. 8 is a side view of a focal magnetic assembly formed in accordance with the present invention for generating a main magnetic field in a small imaging region.

In accordance with further aspects of the present invention, the polarizing system 24 includes a focal magnet assembly 60, as shown in FIG. 8, for generating a main magnetic field. The focal magnet assembly 60 is intended to be used with the splint-coil assembly 26, which generates the needed field gradients and rf excitation fields. Because the focal magnet assembly 60 is portable and maneuverable, the assembly 60 can be positioned with respect to a particular region of a patient as needed. Furthermore, because the imaging region 62 within the focal magnet assembly 60 is substantially open, a surgeon can access a body part of the patient, while the body part is within the imaging region 62. Thus, the focal magnet assembly 60 can be used with the splint-coil assembly 26 and the control and analysis system 22 to generate real-time MR images during surgical procedures.

The particular preferred embodiment shown in FIG. 5 includes a pair of hard magnets 64 and 66 and a support frame 68 for holding the hard magnets 64, 66. The hard magnets 64, 66 can be formed of barium hexaferrite or some other high remanence, high retentivity material having high magnetic anisotropy. The hard magnets 64, 66 are held at spaced apart locations so that an air gap or imaging region 62 is formed between the magnets 64, 66. The polarizations of the magnets 64, 66 are cooperatively oriented so that a homogenous magnetic field is formed in the imaging region 62, as shown generally by the flux lines. A patient's body part is first placed in the splint-coil assembly 26, and the splint-coil assembly 26 is then placed within the imaging region 62.

The support frame 68 includes a base 70, a vertical neck 72, horizontal magnetic support bars 74, 76, and a rotatable stem 78. The elongated vertical neck 72 is attached to the base 70, and the stem 78 is rotatably coupled to the top of the neck 72. The horizontal magnet support bars are held apart-by link bars 80, and are coupled to the stem 78 by tracks formed within the magnet support bar 74, 76, so that the magnet support bars can be slid side-to-side along the stem 78. The hard magnets 64, 66 are secured to the outer ends of the magnet support bars 74, 76. The stem 78 is coupled to the neck 72 by way of two axles 82, 84 that allow the stem 78, and therefore the magnets 64, 66 to be rotated about the two axes formed by the axles 82, 84. Preferably, a ratchet mechanism is included in the base 70 so as to allow the neck 72 and therefore the magnets 64, 66 to be raised and lowered.

Furthermore, preferably, soft magnets 86, 88 are placed on the tips of the hard magnets 64, 66 at the air gap 62. The hard magnets 64, 66 are tapered toward the air gap 62 so as to maximize the field strength at the air gap 62 and to provide greater access to a surgeon or surgical robot to a patient's body part placed within the air gap 62. The soft magnets 86 and 88 are included to further improve the homogeneity and flux density of the magnetic field in the air gap 62. The soft magnets 86, 88 can be formed of a spinel ferrite. The soft magnet material should have a low magnetic retentivity and low magnetic anisotropy. The hard magnets may be optionally equipped with electrical coils for remagnetization between surgical procedures or during a long surgical procedure. Furthermore, the hard magnets 64, 66 may be replaced with super-conducting or nonsuperconducting electrical coils, as long as access to the air gap 62 is not eliminated. Preferably, the magnets are coated with a thick, non-magnetic coating, for example, using one-half inch of carbon-fiber embedded epoxy or plastic.

When the splint-coil assembly 26 is placed within the air gap 62, the sensors 36 formed in the splint-coil assembly 26 are able to sense the strength and orientation of the main field produced by the focal magnet assembly 60. The shim coils 42 within the splint can then be controlled by the control and analysis system 22 to improve the homogeneity of the main field as needed. Furthermore, by sensing the main field strength, the center rf frequency produced and sensed by the rf coils 40 can be adjusted in real-time as the field strength from the hard magnets 64, 66 decreases over time. The center rf frequency should be adjusted as the main field strength decreases because the characteristic Larmar frequency of the body tissue being imaged varies with main field strength. The adjustments of the center rf frequency with respect to main field strength can be determined and stored off line by the use of tuning pulse sequences to determine the optimal center rf frequencies for various main field strengths. In particular, for each main field strength, a series of frequencies can be tested to determine the center rf frequency that produces the optimal resonant response from particular bodily tissue.

As previously explained herein, the present inventors have determined that it is not necessary to have the image gradients in a parallel-orthogonal orientation with respect to the main field. Thus, the orientation of the splint-coil assembly 26 in the air gap 62 is not critical. The sensors 36 included within the splint-coil assembly 26 sense the relative orientation of the gradient fields with respect to the main field, so that the control and analysis system 22 can properly use this information in generating images and in controlling the rf portion of the system.

If, however, it is desired to place the image gradients in a parallel-orthogonal orientation with respect to the main field, orientation systems formed in accordance with further aspects of the present invention can be used. In one orientation system, the control and analysis system 22 can vary the imaging gradients formed by the gradient coils 32 until the image gradients are placed in a parallel-orthogonal orientation with respect to the main field. Alternatively, the control and analysis system 22 can be programmed to always orient the image fields in a parallel-orthogonal orientation with respect to an axis on the splint-coil assembly 26. The splint-coil assembly 26 is then equipped with orienting coils located along this axis. When the splint-coil assembly 26 is placed in the main field in the air gap 62, the orienting coils are then activated by way of the control and analysis system 22, to generate magnetic fields, which are acted upon by the main field to pull the splint 28 into a position of alignment with the main field, i.e., so that the splint axis is parallel to the main field direction.

Nerve Orthogonal Image Planes

Figure 9A:
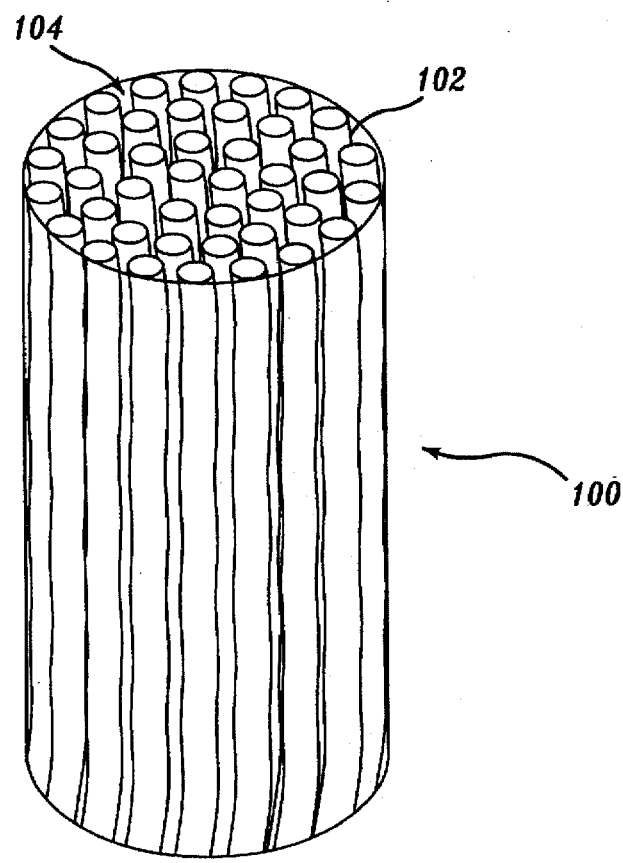
FIGS. 9A and 9B are respectively a side and end pictorial illustration of a nerve and its fascicular structure.
Figure 9B:
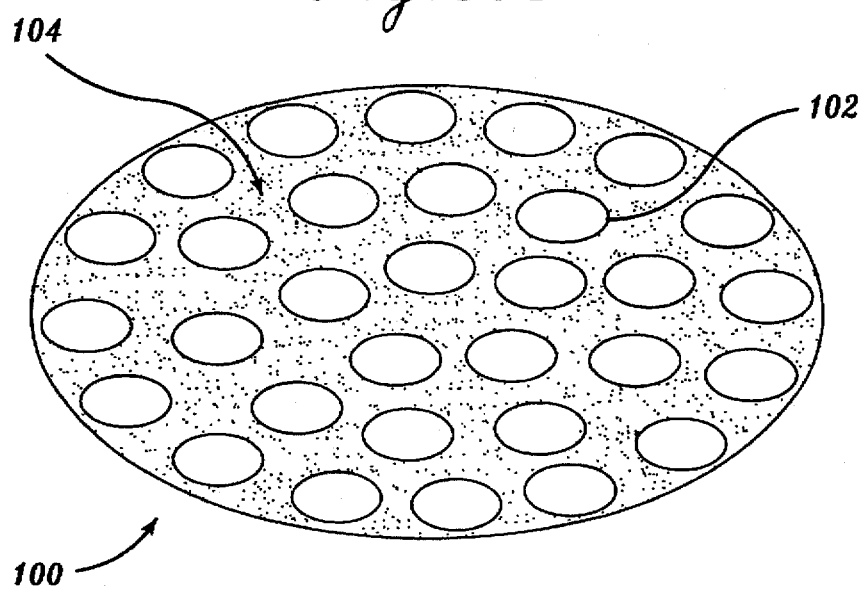

The present inventors have discovered that the fascicular structure of nerves can be clearly and consistently imaged by orienting image gradients to create image planes orthogonal to the nerves. A nerve 100, as illustrated in FIGS. 9A and 9B, has a fascicular structure. In particular, the nerve includes fascicles 102 oriented substantially parallel to the longitudinal axis of the nerve 100. Between the fascicles 102 is interfascicular epineurium 104. The interfascicular epineurium 104 is composed of fibro-fatty tissues, whereas the fascicles are composed of myelin, endoneurial fluid, Schwann cells, and intracellular water of axoplasm within the axons of the nerve cells.

MR imaging techniques provided in the original parent U.S. patent application Ser. No. 08/028,795 make nerve fascicles stand out with respect to the interfascicular epineurium, i.e., the fascicles appear bright and the interfascicular epineurium appears dark. Such enhancement of nerve fascicle is beneficial because the fascicular structure of nerves allow the identification of nerves within surrounding structures. Further, it has now been appreciated by the inventors that much pathology is reflected by alterations in the diameter and image intensity of the fascicles, so that being able to image the fascicles is of great importance. However, MR imaging methods to date have not been able to consistently depict the fascicular pattern within a nerve. The present inventors have discovered that to be able to consistently image nerve fascicular patterns, it is necessary to orient the image planes produced by the image gradients orthogonal to the longitudinal axis of the nerve.

As will be explained with reference to FIGS. 10A and 10B, if the image plane is off perpendicular with respect to the nerve, volume averaging of the fascicular and interfascicular epineurium pattern occurs, so that the pattern is blurred. Furthermore, nerve imaging techniques as provided in the original parent U.S. patent application Ser. No. 08/028,795 are based on using pulse sequences which make a nerve appear brighter than other tissues. Accordingly, it is critical to avoid the loss of signal intensity that can result from volume averaging.

Figure 10A:
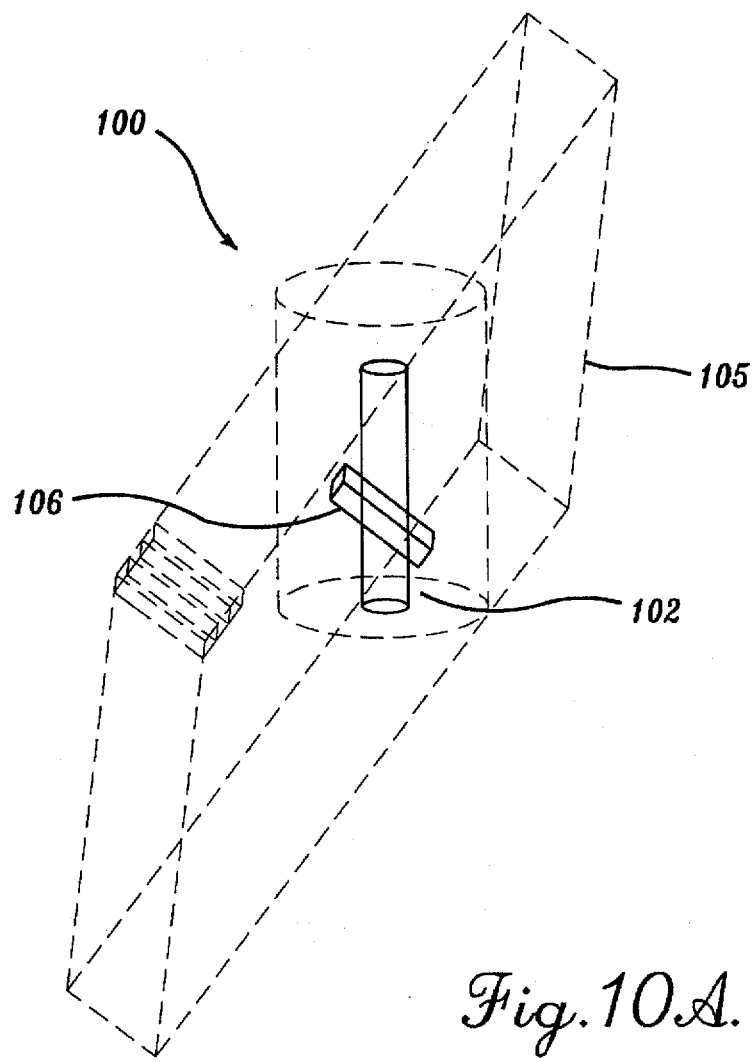
FIGS. 10A and 10B are pictorial diagrams illustrating the importance of nerve-orthogonal image planes, as identified by the present invention.
Figure 10B:
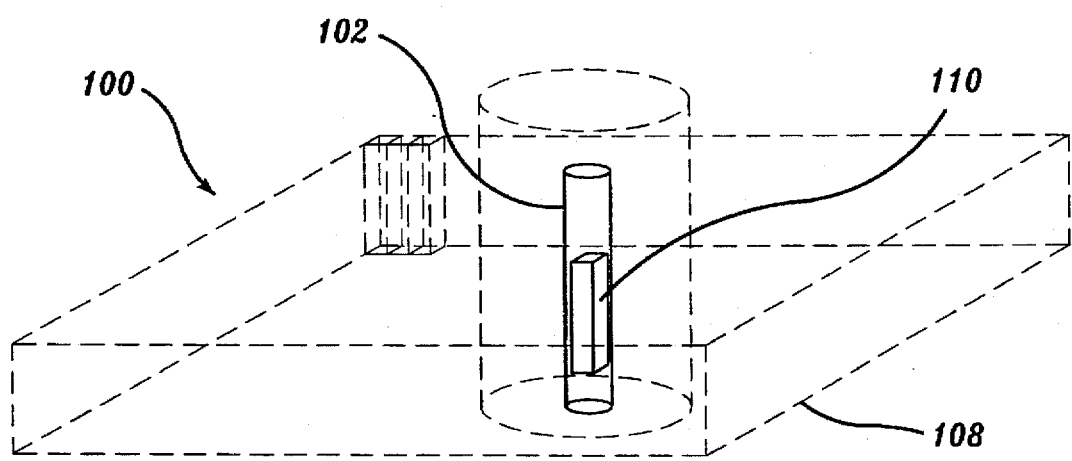

In MR imaging, gradient fields are generated to create image planes such as the image plane 105 shown in FIG. 10A. The image plane 105 is divided into a matrix of voxels 106, which are the elemental imaging volumes. In order to be able to image the very small fascicular pattern within nerves, a high image resolution is needed, i.e., the image plane must be divided into voxels having a small cross-sectional area that can fit within most fascicles. Otherwise, if the voxels are larger in cross-section than the fascicles, intensity averaging will occur due to the overlap of the voxels between high intensity fascicles and low intensity interfascicular epineurium. However, as the cross-sectional area of a voxel is decreased, the volume from which the signal is returned is decreased so that the corresponding signal strength is also decreased.

In order to get an acceptably high return signal from small cross-sectioned voxels, the height of the Voxel 106 is increased, i.e., the image plane 105 is thickened. Depending upon the orientation of the image plane 105, the resulting voxels 106 are sufficiently long to overlap between fascicular and interfascicular epineurium, as illustrated in FIG. 10A. Thus, the resulting return from the voxel 106 is due to a combination of a fascicle and interfascicular epineurium. This results in the blurring of each voxel 106, so that the image intensity of each voxel 106 within the nerve 100 is approximately the same. In other words, ideally the image of a nerve cross-section appears as a checkerboard of white and black areas, corresponding to the respectively high and low signal strengths returned by the fascicles and the interfascicular epineurium. When an elongated voxel 106 overlaps a fascicle and interfascicular epineurium, the white and black checkers intermix to effectively produce a fairly uniform gray image. This gray image not only obscures fascicles, but may also tend to make the nerve similar in intensity to surrounding tissue.

Based upon this discovery, the present inventors were able to identify that the use of nerve-orthogonal image planes such as image plane 108 illustrated in FIG. 7B will increase apparent nerve intensity image clarity. With the image plane 108 oriented perpendicular to the nerve 102, the voxels 110 are parallel to the fascicles and interfascicular epineurium within the nerve 100. Thus, with an appropriately high imaging resolution, the majority of the voxels fall entirely within either a fascicle or interfascicular epineurium, so that the image intensity of the voxels are either very bright or dark. For example, the voxel 110 shown in FIG. 10B falls completely within the fascicle 102, so that the image intensity from that voxel will be bright.

While other tissues such as a liver have an intermixture of cell types exhibiting a checkerboard pattern, the cell types are not directionally oriented, but instead are uniformly intermixed. Thus, when using elongated voxels, each voxel encompasses a mixture of the cell types so that the checkered pattern of the liver is blurred. In contrast to nerves, this cannot be improved by altering the alignment of the image plane.

To be able to orient image planes orthogonal with respect to nerves, the imaging system used should allow for varying the orientation of the image gradients. This can be accomplished with the splint-coil assembly 26 provided by the present invention or, to a degree, with presently available whole-body imaging machines 10 as shown generally in FIG. 1.

In presently available whole-body imaging machines 10, the gradient coils are fixed within the walls of the machine's bore 12. Generally, X, Y and Z gradient coils oriented in a parallel-orthogonal fashion with respect to the polarizing field are included. By applying a calculated mixture of field strengths from the gradient coils, it is possible to generate a resultant image plane with any desired orientation.

However, preferably the splint-coil assembly 26 including the local gradient coils 32 is used. The splint-coil assembly 26 is preferable because it is fixed with respect to the patient. As previously described herein, the elimination of relative motion between the gradient fields and the patient is desirable to improve nerve image quality. Relative motion of the patient within the gradient fields creates spurious water diffusion, which reduces the effectiveness of diffusion-weighted imaging techniques. Furthermore, even if diffusion-weighted imaging is not used, such relative motion can cause image plane voxels to vibrate between fascicles and interfascicular epineurium, as the image is being taken, thereby reducing the clarity with which the fascicular pattern of nerves can be imaged and reducing the apparent intensity of the nerve, and hence its conspicuity and ease of identification.

In three-dimensional image acquisition methods, if the image plane is not oriented orthogonal to the nerve, similar blurring of the fascicular pattern results. Eliminating fascicular pattern blurring is needed not only to allow for the identification of the fascicular pattern of nerves, it also needed to provide reliable assessment of nerve image intensity. Nerve pathology and injuries can be detected in MR images of the nerves by observing the changes in intensity of the nerve. For example, the image intensity of an injured nerve at the site of injury is often different from the image intensity of a normal nerve. If the fascicular pattern is blurred, the image intensity of the nerve is unreliable so that the image intensities cannot be used to detect nerve damage.

Figure 11:
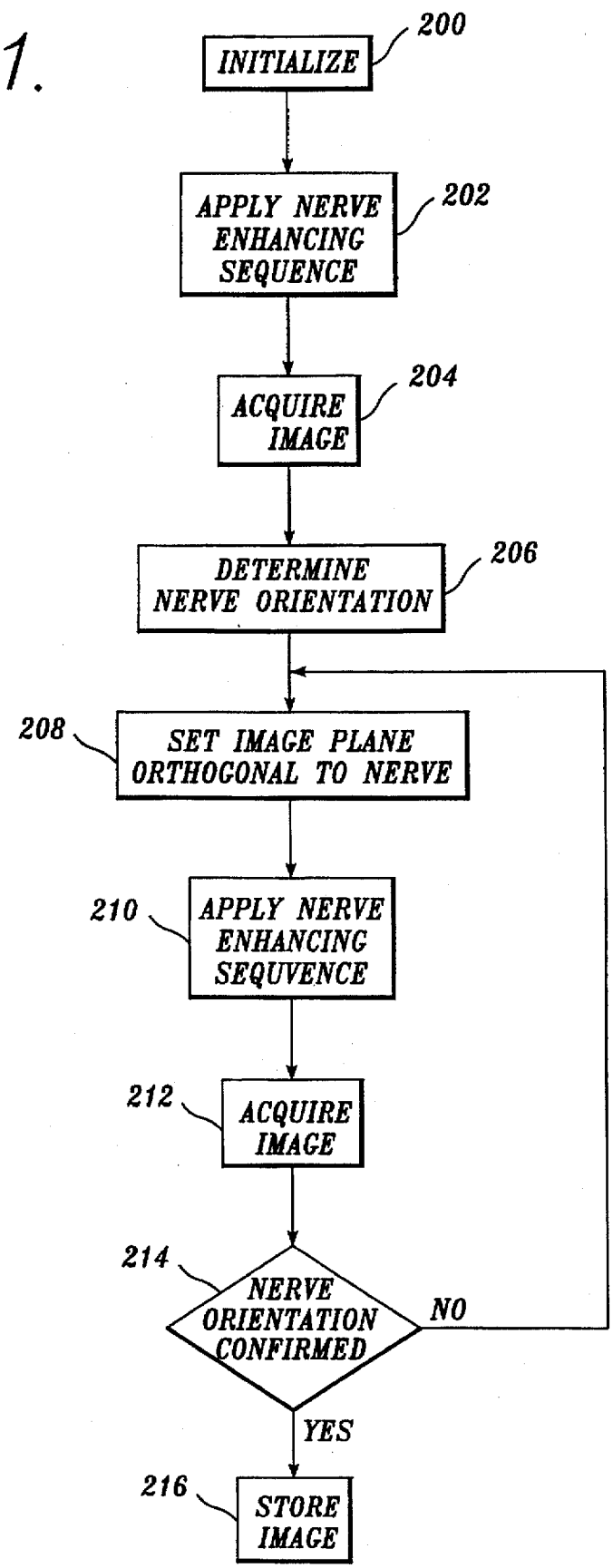
FIG. 11 is flow diagram illustrating a method of imaging nerves with nerve-orthogonal image planes, in accordance with the present invention.

FIG. 11 provides a flow diagram for generating MR images of nerves with nerve-orthogonal image planes. The execution of the process shown in FIG. 8 is controlled by the control and analysis system 22. First, the MRI system 20 is initialized, as indicated at the block 200. Next, at the block 202, a nerve enhancing image sequence is applied to a region of a patient. The resonant response of the patient is acquired and processed to generate an initial image of the region, as indicated at block 204. The image data is then processed to determine the orientation of a particular nerve, as indicated at the block 206 and as explained in greater detail later herein.

With the series of steps indicated by the blocks 208–212, a second image is generated with the image plane oriented orthogonal to the longitudinal axis of the nerve. In particular, as indicated at the block 208, calculations are made to determine the needed image plane orientation, and then a nerve-enhancing imaging sequence is applied using the nerve-orthogonal image plane, as indicated at the block 210. At the block 212, the resonant response of the region of interest is processed to provide a second image.

Then, at the decision diamond 214, the orientation of the nerve within the second image is compared to the nerve orientation in the initial image. If a determination is made that the nerve orientation determined by processing the initial image was correct, the image is stored as indicated at the block 216. However, if a determination is made that the initial nerve orientation determination was incorrect, the series of steps 208–212 are repeated with the image plane oriented orthogonal to the nerve direction determined from the second image. This process is iteratively repeated as needed so as to ensure that an image is generated with a nerve-orthogonal image plane.

In order to speed the process illustrated in FIG. 11, the image planes used in steps 202–206 are oriented in a direction that is likely to be orthogonal to the nerve, based upon generally known nerve paths within the body. For example, nerves generally run parallel to the longitudinal axis of a limb. Thus, preferably the initial image plane is oriented orthogonal to the limb. This preferred initial image plane orientation can be easily accomplished with the split-coil assembly 26 previously described herein. For example, if a person's arm is placed in the split 112 illustrated in FIGS. 5A–5E, the arm will be aligned with the splint 112 and therefore the coils simply by placing the patient's arm in the splint 112. Thus, by creating an initial image plane orthogonal to the longitudinal axis of the splint, the image plane is initially oriented orthogonal to the patient's limb.

To determine the orientation of a nerve in the method of FIG. 11, various techniques can be used. As described in the original parent U.S. patent application Ser. No. 08/028,795, vector analysis can be used in combination with diffusion-weighted imaging to determine the direction of a nerve based upon images of a single cross-section. Alternatively, the process illustrated in FIG. 11 can be modified so that an initial 3D-image is acquired at the steps 202–206 by generating images of multiple cross sections. Similarly, at the steps 208–212, multiple cross-sectional images in which the image plane is oriented perpendicular to the nerve at each cross section can be taken to create a second 3D-image.

For example, in an operator-dependent system, the radiologist uses the hardware provided to collect initial images and then recognizes nerves from their appearance, position, conspicuity, possession of fascicular pattern, and anatomic relations. Often a nerve can be firmly identified in several sections of a large multi-slice volume. When these firm identifications are completed, it then becomes possible to plot a probable course of the nerve involving and passing through other structures which cannot in themselves be firmly identified as nerves other than by their relationships to structures identified as nerves in other sections. The resulting three-dimensional nerve course is then used as the basis of placing a series of orthogonal slices in various orientations which vary as the nerve travels through its more or less complex course. These images are then collected and it is then possible for the operator to confirm or reject decisions about the course of the nerve. This entire process can be rendered in software by an expert system/artificial intelligence image analysis package which is capable of recognizing features suggestive of a neural nature to a given object in an image.

It will be readily appreciated that a reconstruction process is needed to link together images of individual cross sections generated with image planes oriented at varying angles to follow the nerve path. Preferably, each cross-sectional image is stored along with a description of the corresponding image plane's orientation. Using this orientation information, the control analysis system 22 can then properly combine the various cross section images to create a 3D-image.

Furthermore, storing the image plane orientational information along with the image data will allow for a fascicle-by-fascicle reconstruction. Rather than tracing the path of an individual nerve, the path of an individual fascicle can be followed to ensure that image planes are orthogonal to the fascicle. This may be necessary when the fascicles curve significantly within an individual nerve. Using the orientational and image data, it is possible to calculate the position in three-dimensional space of individual cross sections of a fascicle, so that the fascicle cross-sections can be combined to create a three-dimensional image of a fascicle. Where fascicles fuse and split, the control and analysis system 22 can analyze the individual fascicle cross-sections to determine when a fascicle fuses or splits, so that an individual fascicle can be traced. In this fashion, the intensity of individual fascicles can be analyzed. The various fascicles can then be reassembled into a complete nerve for a three-dimensional projectional image. A similar series of steps can be carded out in the course of application of a connectivity algorithm.

In yet another individual fascicle reconstruction technique provided by the present invention, a series of image plane orientations is first determined. For each such plane orientation, a complete multi-slice image data set is obtained through the volume of interest. For an initial fascicle reconstruction task, only those slices from the multi-sliced series which are expected to be useful are used. Subsequently, the fascicle reconstruction may identify areas where individual fascicles turn out of the long axis of the nerve in which they are traveling. In these cases, available images from the multiple multi-sliced image sets can be used selectively to inform the fascicle reconstruction task for a further iteration.

The imaging method provided by the present invention has been tested by the inventors using the oblique image plane capability of the Signa 1.5 Telsa imager from GE Medical Systems. The Signa 1.5 Telsa imager allows the operator to select oblique orientations for an image plane for any pair of the X, Y and Z axes, but does not allow construction of an oblique image plane relative to all three of the axes X, Y and Z. In other words, the image plane must be parallel to one of the axes X, Y or Z.

An initial standard plane scout image was first collected of a person's body part. Based on this initial image, the orientation of selected nerves in the body part was determined. Then the image plane was changed to be orthogonal to the nerves. Using this nerve-orthogonal image plane, two second images were acquired, one using a long T2-weighted sequence (echo time TE of 102 msec) and the other using a long T2-weighted sequence with diffusion-weighting. In both second images, the nerve fascicles were clearly depicted. The second image produced with the long T2 diffusion-weighted sequence was however superior as ligaments and blood vessels were more greatly suppressed.

The long T2 diffusion-weighted sequence used was a modified Fast Spin Echo (FSE) pulse sequence. The benefit of FSE pulse sequences are that they significantly reduce the image acquisition time by including multiple phase encode steps during each sequence. The particular FSE sequence used included a blood flow suppression component using a volume saturation technique and a fat suppression component using a chemical shift suppression (CHESS) pulse technique, both techniques being well known.

The diffusion-weighted gradient was formed by using X and Y gradients orthogonal to the nerve. The strength of each diffusion gradient was approximately 1 Gauss per centimeter. As previously explained herein, higher strength gradients, e.g., 5 Gauss per centimeter, are often required to obtain good nerve images. However, by the use of nerve-orthogonal imaging planes, a clear nerve image was obtained even with the relatively low strength gradient used. The low strength diffusion gradients provided good vessel suppression.

Figure 12:
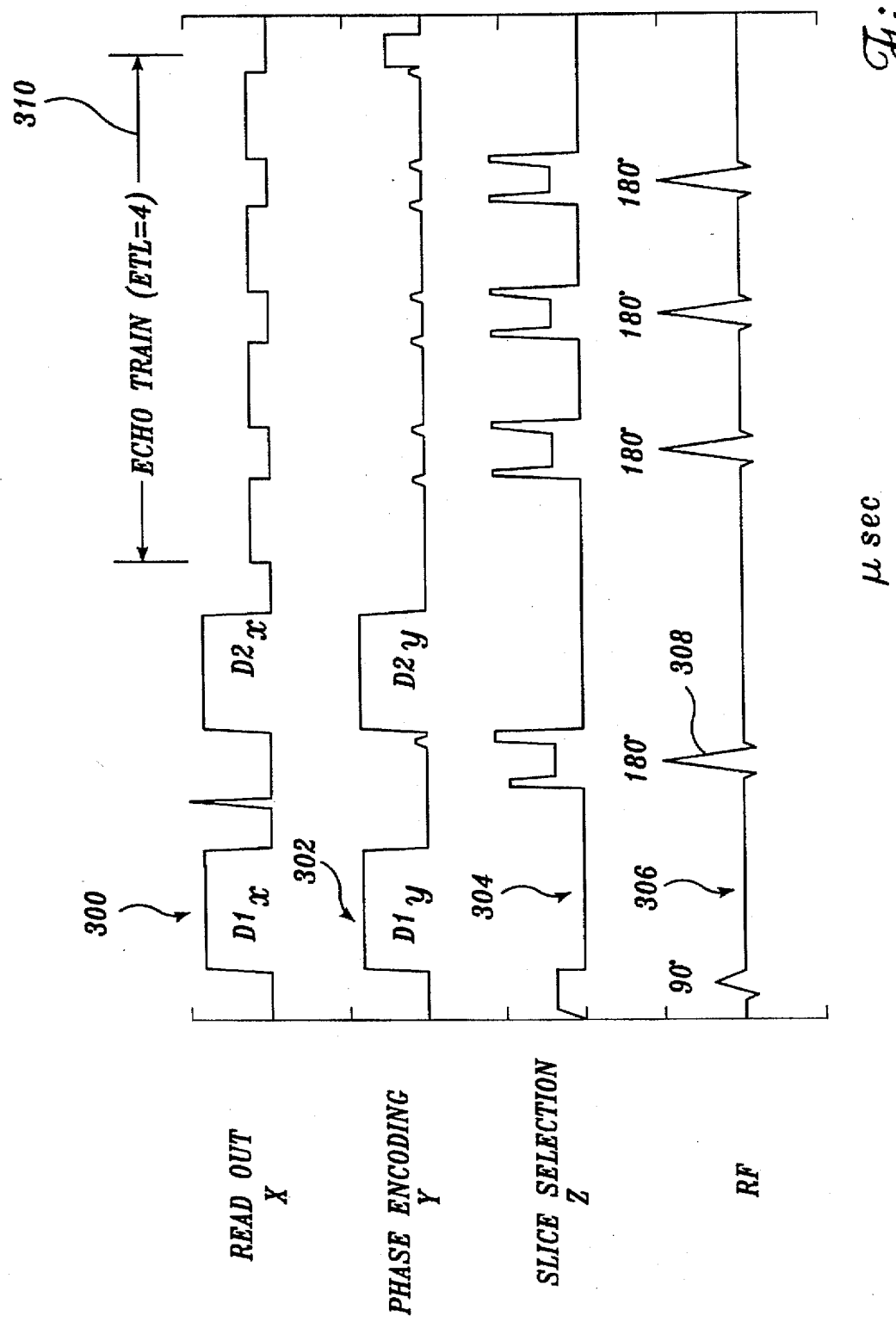
FIG. 12 illustrates a pulse sequence used to image a nerve with nerve-orthogonal image plane, in accordance with the invention.

The modified portion of the FSE pulse sequence used to accomplish this is shown in FIG. 12. The pulse sequence shown includes X diffusion and image gradient pulses 300, Y diffusion and image gradient pulses 302, Z image gradient pulses 304, and rf excitation pulses 306. The X and Y diffusion and image gradient pulse sequences 300, 302 each included double lobes ($D1_x$, $D2_x$ and $D1_y$, $D2_y$). To accommodate the use of double lobes, the initial 180° rf pulse 308 was shifted to the left of the 180° rf pulses in the echo train 310. As shown in FIG. 12, the initial 90° pulse is shifted a corresponding amount to the left.

Reference Image Generation

The neurographic MRI system described above is configured to generate images of small areas within a region of a patient. In order to reference the small image areas collected by this focal MRI system, it may be necessary to generate images of larger areas. By using a nerve enhancing imaging process as disclosed in the original parent U.S. patent application Ser. No. 08/028,795, nerves within an image region will appear brightly. The bright nerves can then be used as fiduciary markers that also appear in a smaller image, to align the smaller image within the larger image which provides an overall reference to the patient's body part. For example, a pre-operative MR image of the entire volume of a limb can be generated using a nerve enhancing imaging sequence with an MRI system that provides a larger imaging area. The nerves appearing in the images can then be used to map the small image regions into the image of the entire limb.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A splint-coil assembly for use with a magnetic resonance imaging coil of the type that generates a main magnetic field in which the magnetic flux of said main magnetic field is stationary and extends in a fixed direction relative to the three mutually orthogonal axes of a three-dimensional spatial reference system, said splint-coil assembly including:

(a) a conformable wall that defines an interior region adapted to receive a body part of a patient for magnetic resonance imaging of the body part when said splint-coil assembly is positioned within said main magnetic field, said conformable wall being conformable so that the splint-coil assembly fits snugly about the body part; and (b) a gradient magnetic coil formed about said conformable wall for generating a gradient magnetic field within said interior region, said gradient magnetic coil being secured to said conformable wall so that said gradient magnetic coil is fixed with respect to the body part, thereby substantially eliminating relative motion between said gradient magnetic field generated by said gradient magnetic coil and the body part;

said splint-coil assembly being sized and configured for placement in said main magnetic field and being positionable at a plurality of selected orientations relative to each of the three mutually orthogonal axes of said three-dimensional spatial reference system.

2. The splint-coil assembly of claim 1 further including a radio-frequency (rf) coil for generating rf electromagnetic fields within said interior region of said splint-coil assembly.

3. The splint-coil assembly of claim 1 further including a shim coil for making minor adjustments to said main magnetic field within said interior region of said splint-coil assembly.

4. The splint-coil assembly of claim 1 further including a stabilization apparatus coupled to said splint-coil assembly to stabilize said splint-coil assembly and said gradient magnetic field at a selected one of said plurality of positions relative to said three mutually orthogonal axes of said three-dimensional spatial reference system during imaging of the body party.

5. The splint-coil assembly of claim 4 wherein said stabilization apparatus includes a balancing coil coupled to said conformable wall for exerting an opposing torque on said splint-coil assembly whenever said gradient magnetic coil exerts torque on said splint-coil assembly.

6. The splint-coil assembly of claim 1, wherein said conformable wall is constructed to form a lateral access port on said conformable wall, for allowing medical personnel to access a region of the body part within said interior region.

7. The splint-coil assembly of claim 1 wherein said gradient magnetic coil is formed as a balanced torque pair so that said gradient magnetic coil exerts substantially no net torque on said splint-coil assembly when said gradient magnetic coil generates changing magnetic fields.

8. A splint-coil assembly for use with a magnetic resonance imaging coil of the type that generates a main magnetic field in which the magnetic flux of the main magnetic field is stationary and extends in a fixed direction relative to the three mutually orthogonal axes of a three-dimensional spatial reference system, said splint-coil assembly comprising:
 (a) a conformable wall that defines an interior region adapted to receive a body part of a patient for magnetic resonance imaging of the body part when said splint-coil assembly is positioned within said main magnetic field, said conformable wall of said splint-coil assembly being conformable so that said splint-coil assembly fits snugly about the body part of the patient;
 (b) at least one magnetic coil formed about said conformable wall for creating magnetic fields within said interior region of said splint-coil assembly, said at least one magnetic coil being secured to said conformable wall so that said at least one magnetic coil is fixed with respect to the body part, thereby substantially eliminating relative motion between the magnetic fields produced by said at least one magnetic coil and the body part;
 wherein said splint-coil assembly is sized and shaped for positioning said splint-coil assembly at a selected orientation relative to the three orthogonal axes of said spatial reference system and said magnetic resonance imaging coil; and wherein,
 (c) said splint-coil assembly further comprises stabilization means for stabilizing the splint-coil assembly at said selected orientation relative to said the three orthogonal axes of said three-dimensional spatial reference system and said magnetic resonance imaging coil, said stabilization means including a support frame and a plurality of extendible rods that are coupled at one end to said support frame and at another end to said splint-coil assembly to collectively form triangulated bracing.

9. The splint-coil assembly of claim 8 wherein said splint-coil assembly is for use with a whole body magnetic resonance imaging system of the type that includes a main field bore and a stretcher that is slidable into the main field bore with a patient on said stretcher with a body part inserted in said splint-coil assembly and wherein said support frame of said stabilization apparatus is mounted to said stretcher.

10. The splint-coil assembly of claim 9, further including means for determining the orientation of said magnetic fields within said interior of said splint-coil assembly relative to said main magnetic field.

11. The splint-coil assembly of claim 10, wherein said means for determining said orientation of said splint-coil assembly within said main magnetic field includes one or more magnetometers, each of said magnetometers supplying a signal representative of the magnetic field that is sensed by that particular magnetometer.

12. The splint-coil assembly of claim 10, wherein said means for determining said orientation of said splint-coil assembly relative to said main magnetic field includes one or more rf sensors, each of said rf sensors supplying a signal representative of the electromagnetic field sensed by that particular rf sensor.

13. A splint-coil assembly for use with a magnetic resonance imaging coil of the type that generates a main magnetic field in which the magnetic flux of the main magnetic field is stationary and extends in a fixed direction relative to the three mutually orthogonal axes of a three-dimensional spatial reference system, said splint-coil assembly comprising:
 (a) a conformable wall that defines an interior region adapted to receive a body part of a patient for magnetic resonance imaging of the body part when said splint-coil assembly is positioned within said main magnetic field, said conformable wall of said splint-coil assembly being conformable so that said splint-coil assembly fits snugly about the body part of the patient;
 (b) at least one magnetic coil formed about said conformable wall for creating magnetic fields within said interior region of said splint-coil, said at least one magnetic coil being secured to said conformable wall so that said at least one magnetic coil is fixed with respect to the body part, thereby substantially eliminating relative motion between the magnetic fields produced by said at least one magnetic coil and the body part;
 wherein said splint-coil assembly is sized and shaped for positioning said splint-coil assembly at a selected orientation relative to the three orthogonal axes of said spatial reference system and said magnetic resonance imaging coil; and
 (c) wherein said splint-coil assembly further comprises means for determining the orientation of said magnetic fields within said interior of said splint-coil assembly relative to said predetermined orientation of said main magnetic field.

14. The splint-coil assembly of claim 13 wherein said means for determining said orientation of said magnetic fields within said interior of said splint-coil assembly relative to said main magnetic field includes one or more magnetometers, each of said magnetometers supplying a signal representative of the magnetic field that is sensed by that particular magnetometer.

15. The splint-coil assembly of claim 13 wherein said means for determining said orientation of said magnetic fields within said interior of said splint-coil assembly relative to said predetermined orientation of said main magnetic field includes one or more rf sensors, each of said rf sensors supplying a signal representative of the electromagnetic field sensed by that particular rf sensor.

16. A splint-coil assembly for use with a magnetic resonance imaging coil of the type that generates a main magnetic field in which the magnetic flux of the main magnetic field is stationary and extends in a fixed direction relative to the three mutually orthogonal axes of a three-dimensional spatial reference system, said splint-coil assembly comprising:
 (a) a conformable wall that defines an interior region adapted to receive a body part of a patient for magnetic resonance imaging of the body part when said splint-coil assembly is positioned within said main magnetic field, said conformable wall being conformable so that the splint-coil assembly fits snugly about the body part;
 (b) a gradient magnetic coil formed about said conformable wall for generating a gradient magnetic field within said interior region, said gradient magnetic coil being secured to said conformable wall so that said gradient magnetic coil is fixed with respect to the body part, thereby substantially eliminating relative motion between said magnetic gradient field generated by said gradient magnetic coil and the body part;

wherein said splint-coil assembly is sized and shaped for positioning said splint-coil assembly at a selected orientation relative to the three orthogonal axes of said spatial reference system and said magnetic resonance imaging coil; and wherein;

said splint-coil further comprises means for determining the orientation of said magnetic fields within said interior of said splint-coil assembly relative to said predetermined orientation of said main magnetic field.

17. The splint-coil assembly of claim 16 wherein said means for determining said orientation of said splint-coil assembly within said main magnetic field includes one or more magnetometers, each of said magnetometers supplying a signal representative of the magnetic field that is sensed by that particular magnetometer.

18. The splint-coil assembly of claim 16 wherein said means for determining said orientation of said splint-coil assembly relative to said predetermined orientation of said main magnetic field includes one or more rf sensors, each of said rf sensors supplying a signal representative of the electromagnetic field sensed by that particular rf sensor.

19. A splint-coil assembly for use with a magnetic resonance imaging coil of the type that generates a main magnetic field in which the magnetic flux of the main magnetic field is stationary and extends in a fixed direction relative to the three mutually orthogonal axes of a three-dimensional spatial reference system, said splint-coil assembly comprising:

(a) an exterior shell and an inflatable liner that defines a conformable wall and is surrounded by said exterior shell, said conformable wall defining an interior region adapted to receive a body part of a patient for magnetic resonance imaging of the body part when said splint-coil assembly is positioned within said main magnetic field, said inflatable liner of said splint-coil assembly being filled under pressure with a paramagnetically doped fluid to fit said splint-coil assembly snugly about the body part of the patient;

(b) at least one magnetic coil formed about said conformable wall for creating magnetic fields within said interior region of said splint-coil, said at least one magnetic coil being secured to said conformable wall so that said at least one magnetic coil is fixed with respect to the body part, thereby substantially eliminating relative motion between the magnetic fields produced by said at least one magnetic coil and the body part;

said splint-coil assembly being of a size and shape for positioning said splint-coil assembly at a selected orientation relative to the three orthogonal axes of said spatial reference system and said magnetic resonance imaging coil.

20. The splint-coil assembly of claim 19, wherein said at least one magnetic coil includes a gradient coil for establishing a magnetic gradient field within said interior region of said splint-coil.

* * * * *